United States Patent [19]

Shirasaki et al.

[11] Patent Number: 5,489,669

[45] Date of Patent: Feb. 6, 1996

[54] POLYIMIDE AND PROCESS FOR PRODUCING THE SAME

[75] Inventors: Mika Shirasaki; Mitsuhiro Shibata, both of Tsukuba; Shuichi Kanagawa, Tsuchiura, all of Japan

[73] Assignee: Sumitomo Chemical Company, Limited, Osaka, Japan

[21] Appl. No.: 269,390

[22] Filed: Jun. 30, 1994

[30] Foreign Application Priority Data

Jul. 9, 1993 [JP] Japan ................. 5-170529
Jul. 12, 1993 [JP] Japan ................. 5-171489

[51] Int. Cl.⁶ ................................. C08G 69/28
[52] U.S. Cl. ................. 528/351; 528/176; 528/179; 528/183; 528/185; 528/188; 528/352; 528/353; 528/503; 524/81
[58] Field of Search ................. 528/351, 352, 528/353, 503, 176, 179, 183, 185, 188; 524/81

[56] References Cited

U.S. PATENT DOCUMENTS 4,965,339  10/1990  Maruyama et al. .

FOREIGN PATENT DOCUMENTS 0282254  9/1988  European Pat. Off. .
0389092  9/1990  European Pat. Off. .
0400635  12/1990  European Pat. Off. .

Primary Examiner—Samuel A. Acquah
Attorney, Agent, or Firm—Stevens, Davis, Miller & Mosher

[57] ABSTRACT

A polyimide represented by the general formula (1):

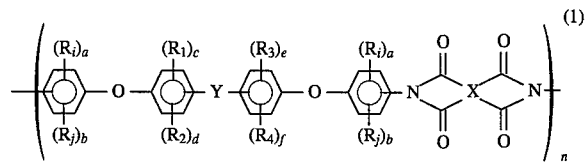

wherein Y represents a hydrocarbon group having 4 to 20 carbon atoms or a sulfur atom; each of $R_1$ to $R_4$, $R_i$ and $R_j$ represents a halogen atom, a hydrocarbon group having 1 to 6 carbon atoms or a halogen-containing hydrocarbon group having 1 to 6 carbon atoms; each of a, b, c, d, e and f represents an integer of 0 to 4 satisfying $a+b \leq 4$, $c+d \leq 4$ and $e+f \leq 4$; and X represents a tetravalent organic group having 2 or more carbon atoms.

16 Claims, 20 Drawing Sheets

POLYIMIDE AND PROCESS FOR PRODUCING THE SAME

BACKGROUND OF THE INVENTION

This invention relates to a novel polyimide excellent in solubility and low dielectric properties, and the polyimide is utilized in various protective films for semiconductors, insulating films between layers, orientated films for liquid crystal elements, base films for flexible printed wiring boards, gas-permeable films, other various insulating films, resins for electronic parts, resins for structural materials, heat-resistant adhesions and the like.

Polyimides are often used in electric and electronic fields utilizing their high heat resistance and excellent characteristics in respect of mechanical strength and electrical insulating properties. However, conventional aromatic polyimides have high melting points and are insoluble in solvents, and hence, it was difficult to mold the aromatic polyimides into a film or the like. For example, an aromatic polyimide obtained by condensation of 4,4-diaminodiphenyl ether with pyromellitic dianhydride (Kapton, a trade name of DU PONT in U.S.A.) has a melting point of 500° C. or higher and is low in solubility, and hence, is usually formed into a film by such a method that a polar solvent solution of a polyamic acid which is its precursor is cast into a film and the film is then heated at a temperature of 300° C. or higher to complete imidization.

Thus, conventional aromatic polyimides are required to be heat-treated at a high temperature of 300° C. or higher in order to form them into a film or the like, and have had such a problem that electron elements, substrates, metal wirings and the like undergo heat deterioration at such high temperatures to cause a reduction of reliability. Also, there has been a problem that since films formed at such high temperatures shrink after the formation, stress and strain remain in the films, whereby the films are curled. Therefore, development of an aromatic polyimide which can be formed into a film or the like directly at a relatively low temperature has been desired. Also, recently, because of requirement of high speed electrical transmission of signals in a computer or the like, it has been desired that the polyimide is allowed to have a low dielectric constant in addition to the excellent insulating properties which conventional polyimides have.

Under such circumstances, as a polyimide which is soluble and has low dielectric properties, for example, a fluorine-introduced polyimide has been developed (see, for example, Japanese Patent Application Kokai No. 4-239,037); however, this is very expensive and is difficult to produce on a commercial scale. Moreover, as represented by a Teflon, a resin containing a large amount of fluorine has many problems such as reduction of adhesiveness and the like.

SUMMARY OF THE INVENTION

An object of this invention is to provide a novel polyimide which has, in addition to the excellent characteristics inherent to polyimides, an excellent solubility and low dielectric properties.

The present inventors have made extensive research for achieving the above object and have consequently found that an aromatic polyimide having a specific structure is excellent in solubility and has low dielectric properties without impairing the various physical properties inherent to polyimides to complete this invention.

According to this invention, there is provided a polyimide and a process for producing the same, said polyimide having a recurring structural unit represented by the general formula (1):

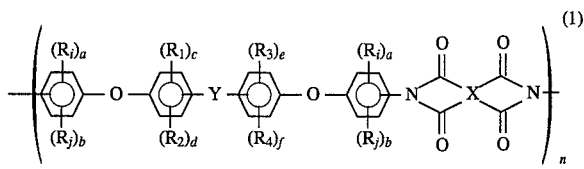

wherein Y represents a hydrocarbon group having 4 to 20 carbon atoms or a sulfur atom, each of $R_1$ to $R_4$, $R_i$ and $R_j$ represents a halogen atom, a hydrocarbon group having 1 to 6 carbon atoms or a halogen-containing hydrocarbon group having 1 to 6 carbon atoms, each of a, b, c, d, e and f represents an integer of 0 to 4 satisfying $a+b \leq 4$, $c+d \leq 4$ and $e+f \leq 4$ and X represents a tetravalent organic group having 2 or more carbon atoms.

DETAILED DESCRIPTION OF THE INVENTION

Figure 1:
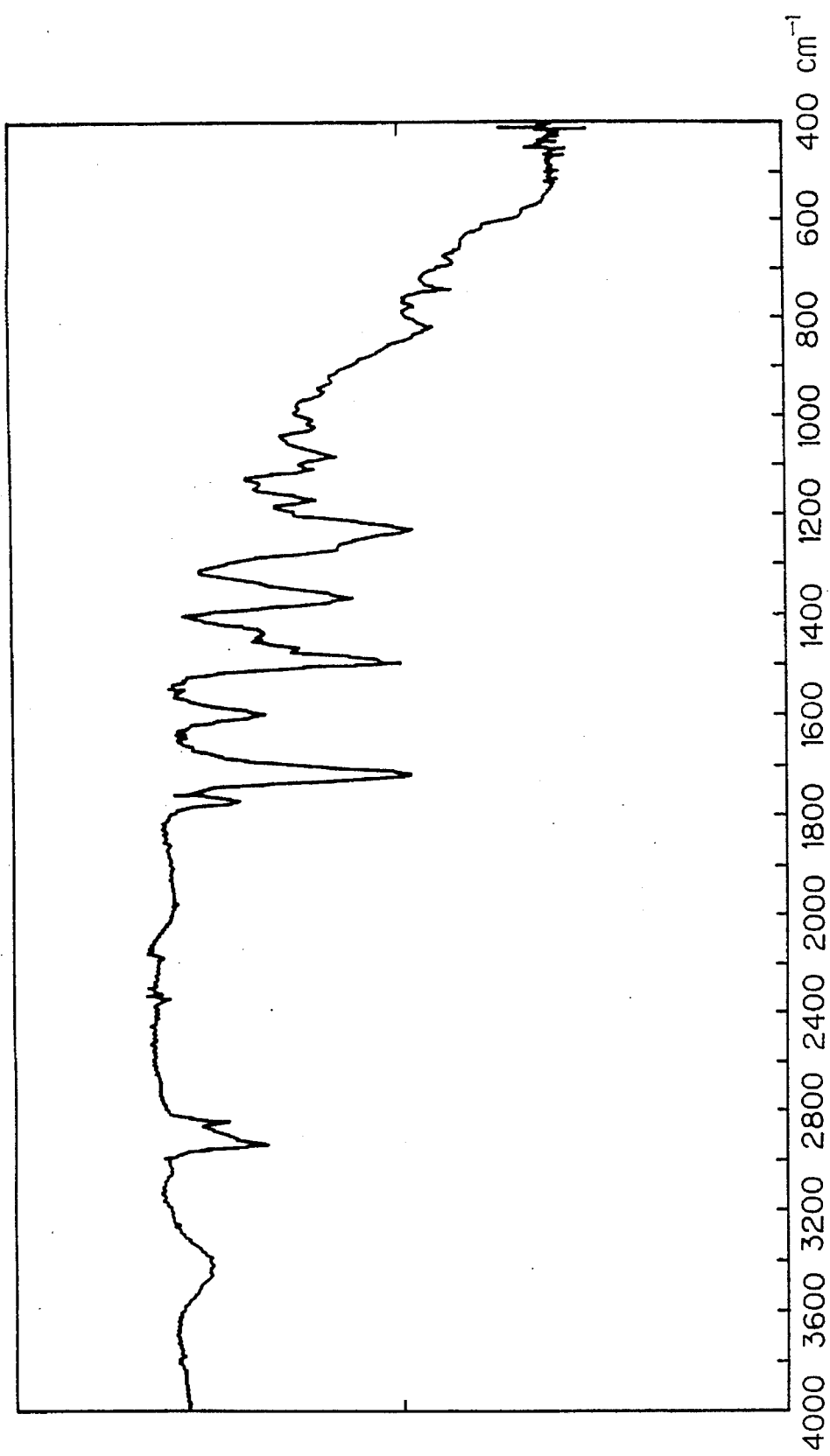
FIG. 1 shows an infrared absorption spectrum of the polyimide of this invention obtained in Example 1.

The polyimide of this invention is obtained by polycondensing a diamino compound represented by the general formula (2):

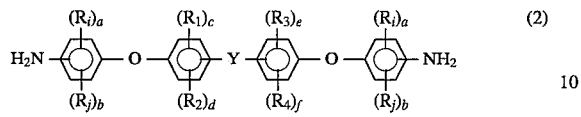

wherein Y represents a hydrocarbon group having 4 to 20 carbon atoms or a sulfur atom; each of $R_1$ to $R_4$, $R_i$ and $R_j$ represents a halogen atom, a hydrocarbon group having 1 to 6 carbon atoms or a halogen-containing hydrocarbon group having 1 to 6 carbon atoms; each of a, b, c, d, e and f represents an integer of 0 to 4 satisfying $a+b \leq 4$, $c+d \leq 4$ and $e+f \leq 4$; and X represents a tetravalent organic group having 2 or more carbon atoms, with a tetracarboxylic dianhydride represented by the general formula (3):

wherein X represents a tetravalent organic group having 2 or more carbon atoms.

In the general formula (2), the halogen atom used as $R_1$ to $R_4$, $R_i$ and $R_j$ includes fluorine atom, chlorine atom, bromine atom and iodine atom, the hydrocarbon group having 1 to 6 carbon atoms includes hydrocarbon groups, for example, straight or branched chain alkyl groups such as methyl, ethyl, propyl, butyl, pentyl and hexyl; cyclohexyl group; phenyl group and the like, and the halogen-containing hydrocarbon groups having 1 to 6 carbon atoms includes the above-mentioned hydrocarbon groups whose at least one hydrogen atom has been substituted by a halogen atom or halogen atoms.

In the general formula (2), the hydrocarbon group having 4 to 20 carbon atoms used as Y includes alkylidene groups having 4 to 14 carbon atoms, phenylalkylidene groups having 7 to 20 carbon atoms and alicyclic structure-containing hydrocarbon groups having 5 to 20 carbon atoms.

Typical examples of the alkylidene group having 4 to 14 carbon atoms include straight and branched chain alkylidene groups such as butylidene, pentylidene, hexylidene, heptylidene and the like; typical examples of the phenylalkylidene group having 7 to 20 carbon atom include straight and branched chain phenylalkylidene groups such as phenylmethylidene, phenylethylidene, phenylpropylidene and the like. Furthermore, typical examples of the alicyclic structure-containing hydrocarbon group having 5 to 20 carbon atoms include groups represented by formulas (a), (b), (c), (d), (e) and (f) and those groups whose at least one hydrogen atom in the alicyclic ring has been substituted by an alkyl group or alkyl groups such as methyl, ethyl and the like:

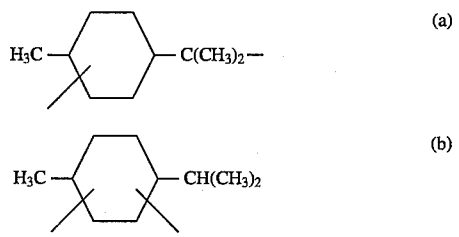

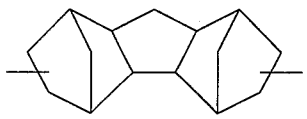

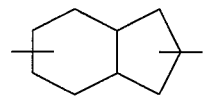

Among the above alicyclic structure-containing hydrocarbon groups, those represented by formulas (a), (b) and (c) are preferred.

Among the diamino compounds represented by the general formula (2), those in which Y is a sulfur atom or a butylidene group and the number of the total carbon atoms of $(R_1)_c$, $(R_2)_d$, $(R_3)_e$ and $(R_4)_f$ is 4 or more are preferable, and those in which c and e are 1 and $R_1$ and $R_2$ are tertiary butyl groups are more preferable.

Typical examples of the diamino compounds represented by the general formula (2) are as follows: Bis[4-(4-aminophenoxy)-3-t-butyl-6-methylphenyl] sulfide, bis[3-(4-aminophenoxy)-3-t-butyl-6-methylphenyl] sulfide, 1,1-bis[4-(4-aminophenoxy)-3-t-butyl-6methylphenyl]butane, 1,1-bis[3-(4-aminophenoxy)-3-t-butyl- 6-methylphenyl]butane, 1,1-bis[4-(4-aminophenoxy)- 3-t-butyl-6-methylphenyl] pentane, 1,1-bis[3-(4-aminophenoxy)- 3-t-butyl-6-methylphenyl]pentane, 1,1-bis[4-(4-aminophenoxy)- 3-t-butyl-6-methylphenyl]hexane, 1,1bis[ 3-(4-aminophenoxy)-3-t-butyl-6-methylphenyl]hexane, 1,1-bis[4-(4-aminophenoxy)-3-t-butyl-6-methylphenyl]heptane, 1,1-bis [3-(4-aminophenoxy)-3-t-butyl-6-methylphenyl]heptane, bis[4-(4-aminophenoxy)phenyl]menthane, bis[2-(4-aminophenoxy)phenyl]menthane, 1-[2-(4-aminophenoxy)phenyl] -8-[4-(4-aminophenoxy)phenyl]menthane, bis[4-(3-aminophenoxy)phenyl]menthane, bis[2-(3-aminophenoxy)phenyl] menthane, 1-[2-(3-aminophenoxy)phenyl]-8-[ 4-(3-aminophenoxy)phenyl] menthane, bis[4-(4-aminophenoxy)- 3-methylphenyl] menthane, bis[4-(4-aminophenoxy)- 3,5-dimethylphenyl] menthane, bis[4-(4-aminophenoxy)- 3-butyl-6-methylphenyl]menthane, bis[(4-amino- 5-methylphenoxy)-3-methylphenyl]menthane, bis[4-(4-amino-5-methylphenoxy)-3,5-dimethylphenyl]menthane, bis[4-(4-amino-5-methylphenoxy)-3-butyl-6-methylphenyl] menthane, bis[2-(4-aminophenoxy)-3-methylphenyl]menthane, 1-[2-(4-aminophenoxy)-3-methylphenyl]-8-[4-(4-aminophenoxy)- 3-methylphenyl]menthane, bis[4-(4-aminophenoxy)phenyl] tricyclo[5,2,1,0$^{2,6}$]decane, bis[2-(4aminophenoxy)phenyl] tricyclo[5,2,1,0$^{2,6}$]decane, [2-(4aminophenoxy)phenyl] -[4-(4-aminophenoxy)phenyl] tricyclo[ 5,2,1,0$^{2,6}$]decane, bis[4-(3-aminophenoxy)phenyl] tricyclo[5,2,1,0$^{2,6}$]decane, bis[2-(3-aminophenoxy)phenyl] tricyclo[5,2,1,0$^{2,6}$]decane, [2-(3aminophenoxy)phenyl] -[4-(3-aminophenoxy)phenyl]tricyclo[ 5,2,1,0$^{2,6}$]decane, bis[4-(4-aminophenoxy)-3-methylphenyl] tricyclo[5,2,1,0$^{2,6}$]decane, bis[4-(4-aminophenoxy)- 3,5-dimethylphenyl]tricyclo [5,2,1,0$^{2,6}$]decane, bis[4-(4-aminophenoxy)- 3-butyl-6-methylphenyl]tricyclo[ 5,2,1,0$^{2,6}$]decane, bis[4-(4-amino-5- methylphenoxy)-3-methylphenyl] tricyclo[5,2,1,0$^{2,6}$] decane, bis[4-(4-amino- 5-methylphenoxy)-3,5-dimethylphenyl]tricyclo[5,2,1,0$^{2,6}$]-decane, bis[4-(4-amino-5-methylphenoxy)-3-butyl-6-methylphenyl] tricyclo[5,2,1, 0$^{2,6}$]decane, bis[2-(4-aminophenoxy)- 3-methylphenyl] tricyclo[5,2,1,0$^{2,6}$]decane, [2-( 4-aminophenoxy)-3-methylphenyl]-[4-(4-aminophenoxy)-3-methylphenyl] tricyclo[5,2,1,0$^{2,6}$]decane and the like.

Among them, preferable are 1,1-bis[4-(4-aminophenoxy)- 3-t-butyl-6-methylphenyl]butane, bis[4-(4-aminophenoxy)phenyl] menthane and bis[4-(4-aminophenoxy)-3,5-dimethylphenyl]tricyclo[5,2,1,0$^{2,6}$]decane.

As the tetracarboxylic dianhydride represented by the general formula (3), all those capable of condensing with the above-mentioned diamino compounds can be applied; however, typical examples thereof are as follows: Ethylene tetracarboxylic dianhydride, cyclopentane tetracarboxylic dianhydride, pyromellitic dianhydride, 3,3',4,4'-benzophenone tetracarboxylic dianhydride, 2,2',3,3'-benzophenone tetracarboxylic dianhydride, 3,3',4,4'-biphenyl tetracarboxylic dianhydride, 2,2',3,3'-biphenyl tetracarboxylic dianhydride, 3,3',4,4'-diphenylsulfone tetracarboxylic dianhydride, 3,3',4,4'-diphenylhexafluoroisopropane tetracarboxylic dianhydride, 4,4'-oxydiphthalic dianhydride, 2,3,6,7-naphthalene tetracarboxylic dianhydride, 1,4,5,8-naphthalene tetracarboxylic dianhydride, 1,2,5,6-naphthalene tetracarboxylic dianhydride, 2,3,6,7-anthracene tetracarboxylic dianhydride, 1,2,7,8-phenanthrene tetracarboxylic dianhydride, 4-(1,2-dicarboxyethyl)- 4-methyl-1,2,3,4-tetrahydro-1,2-naphthalene dicarboxylic dianhydride, 2,2-bis[4-(3,4-dicarboxyphenoxy)phenyl] propane dianhydride, 5-(1,2-dicarboxyethyl)- 3-methyl-1,2,5,6-tetrahydrophthalic dianhydride, 6-methyltricyclo[6,2,2,0$^{2,7}$]-dodeca-6,11-diene- 3,4,9,10-tetracarboxylic dianhydride and the like. These tetracarboxylic dianhydrides may be used alone or in admixture of two or more.

As the process for producing the polyimide of this invention, any process capable of producing a polyimide can be applied, and preferable is a process comprising reacting a diamino compound of the general formula (2) with a tetracarboxylic dianhydride of the general formula (3) in a suitable solvent to obtain a solution of a polyamic acid which is a polyimide precursor, and then thermally or chemically cyclo-dehydrating the polyamic acid in the solution or after casting the solution onto a suitable substrate. The molar ratio of the diamino compound to the tetracarboxylic dianhydride is selected from the range of from 1/0.5 to ½, and when a high molecular weight polymer is desired to be obtained, the reaction is effected at a molar ratio near 1/1. Also, in order to control the molecular weight, an aromatic monoamine or an aromatic dicarboxylic anhydride may be added to make the terminals non-reactive.

The solvent to be used in the synthesis of the polyamic acid and polyimide, any solvent capable of dissolving the above diamino compound and tetracarboxylic dianhydride can be applied; however, typical example thereof are as follows: N-methyl-2-pyrrolidone (referred to hereinafter as NMP), N,N-dimethylacetamide, N,N-diethylacetamide, N,N-dimethylformamide, dimethyl sulfoxide, N-methyl-ε-caprolactam, γ-butyrolactone, 1,3-dimethyl-2-imidazolidinone, tetramethylurea, hexamethylphosphoramide, m-cresol, p-cresol, o-cresol, xylenol, pyridine, 1,2-dimethoxyethane, tetrahydrofuran, 1,4-dioxane, Diglyme and the like. These solvents may be used alone or in admixture of two or more. The concentration is adjusted so as to become about 1 to 50% by weight, preferably about 5 to 20% by weight, in term of the sum of the weights of the diamino compound and the tetracarboxylic dianhydride. As an azeotropic dehydration solvent in the imidation, it is possible to add cyclohexane, benzene, toluene, xylene, mesitylene, chlorobenzene, N-cyclohexyl- 2-pyrrolidone or the like.

The reaction temperature for the synthesis of polyamic acid is usually 250° C. or lower, preferably 60° C. or lower. The reaction pressure is not critical and the reaction can be satisfactorily carried out at atmospheric pressure. The reaction time may be varied depending upon the kinds of the diamine and acid anhydride used, the solvent and the reaction temperature; however, it is usually 10 minutes to 24 hours. The polyamic acid obtained is converted to the corresponding polyimide by heating to 100° to 400° C., or alternatively, chemically imidized by treatment with a dehydrating agent such as a mixture of acetic anhydride and tertiary amine.

When the polyimide is obtained in solution, it is possible to convert the same to a powder by concentrating the solution or pouring the solution into a poor solvent to precipitate the polyimide. Also, the solution may be cast onto a substrate to obtain a film of the polyimide.

DESCRIPTION OF THE PREFERRED EMBODIMENTS

This invention is further explained in more detail below referring to Examples and Comparative Examples; however, this invention should not be interpreted to be limited to the Examples. Incidentally, the measurement method and apparatus used in the Examples and Comparative Examples are as follows:

Infrared absorption spectrum: An IR-700 apparatus manufactured by Nippon Bunko Kogyo K. K. was used, by which the powder was measured according to the KBr method and the film was measured as it was.

Solubility: The solubility of 10% of a resin in each solvent was measured at room temperature and at 150° C. Thermal analysis: A SSC-5200H system manufactured by Seiko Denshi Kogyo K. K. was used.

Thermobalance: A TG/DTA220 apparatus was used and the pyrolysis temperature (Td) was measured at 10° C./min at 30°–600° C. under a N$_2$ atmosphere.

Differential scanning calorimeter: A DSC220C apparatus was used, and the glass transition temperature (Tg) was measured at 10° C./min at 30°–400° C. under a N$_2$ atmosphere. Dielectric constant, dielectric loss tangent: A LCR meter 4275A apparatus manufactured by Yokogawa-Hewlett-Packard Ltd. was used and a gold electrode was vapor-deposited on both surfaces of a sample. Measurement was conducted at 1 MHz.

EXAMPLE 1

In a 100-ml, four-necked flask equipped with a nitrogen gas-introducing tube, a thermometer and a stirrer were placed 5.64 g (0.01 mole) of 1,1-bis[4-(4-aminophenoxy)-3-t-butyl-6-methylphenyl]butane and 49.5 g of NMP to dissolve the former in the latter, upon which 3.10 g (0.01 mole) of 4,4'-oxydiphthalic dianhydride was added thereto. The resulting mixture was stirred at room temperature for three hours under a nitrogen stream to obtain a polyamic acid solution. A part of the polyamic acid solution was separated therefrom and the remainder was heated to 190° C., at which the solution was stirred for five hours under a nitrogen stream (the water formed was removed together with the nitrogen out of the system). The reaction mixture was poured into methanol which was being vigorously stirred to precipitate a resin. The resin was separated by filtration and dried at 150° C. overnight under reduced pressure to obtain a polyimide powder.

EXAMPLE 2

The part of the polyamic acid solution separated in Example 1 was cast onto a glass plate, dried at 100° C. overnight under reduced pressure, and then heated at 200° C. for one hour under reduced pressure, further at 250° C. for one hour under ventilation to obtain a polyimide film.

EXAMPLE 3

In a 100-ml, four-necked flask equipped with a nitrogen gas-introducing tube, a thermometer and a stirrer were placed 5.06 g (0.01 mole) of bis[4-(4-aminophenoxy)phenyl] menthane and 46.2 g of NMP to dissolve the former in the latter, upon which 3.10 g (0.01 mole) of 4,4'-oxydiphthalic dianhydride was added thereto. The resulting mixture was stirred at room temperature for three hours under a nitrogen stream to obtain a polyamic acid solution. A part of the polyamic acid solution was separated therefrom, and the remainder was heated to 190° C. at which the solution was stirred for five hours under a nitrogen stream (the water formed was removed together with nitrogen out of the system). The reaction mixture was poured into methanol which was being vigorously stirred, to precipitate a resin. The resin was separated by filtration and then dried at 150° C. overnight under reduced pressure to obtain a polyimide powder.

EXAMPLE 4

The part of the polyamic acid solution separated in Example 3 was cast onto a glass plate and dried at 100° C. overnight under reduced pressure and thereafter heated at 200° C. for one hour under reduced pressure and further at 250° C. for one hour under ventilation to obtain a polyimide film.

EXAMPLE 5

In a 100-ml, four-necked flask equipped with a nitrogen gas-introducing tube, a thermometer and a stirrer were placed 5.58 g (0.01 mole) of bis[4-(4-aminophenoxy)- 3,5-dimethylphenyl]tricyclo[5,2,1,0$^{2,6}$]decane and 49.2 g of NMP to dissolve the former in the latter, upon which 3.10 g (0.01 mole) of 4,4'-oxydiphthalic dianhydride was added thereto. The resulting mixture was stirred at room temperature for three hours under a nitrogen stream to obtain a polyamic acid solution. A part of the polyamic acid solution was separated therefrom, and thereafter, 28.9 g of NMP was added to the remainder to dilute the solution, and the resulting mixture was heated to 190° C. and stirred at said temperature for five hours under a nitrogen stream (the water formed was removed together with nitrogen out of the system). The reaction mixture was poured into methanol which was being vigorously stirred to precipitate a resin. The resin was separated by filtration and then dried at 150° C. overnight under reduced pressure to obtain a polyimide powder.

EXAMPLE 6

The part of polyamic acid solution separated in Example 5 was cast onto a glass plate, dried at 100° C. overnight under reduced pressure, and heated at 200° C. for one hour under reduced pressure and then at 250° C. for one hour under ventilation to obtain a polyimide film.

EXAMPLE 7

In the same manner as in Example 1, 5.64 g (0.01 mole) of 1,1-bis[4-(4-aminophenoxy)-3-t-butyl-6-methylphenyl] butane was dissolved in 52.3 g of NMP, upon which 3.58 g (0.01 mole) of 3,3',4,4'-diphenylsulfone tetracarboxylic dianhydride was added to the solution to prepare a polyamic acid solution, from which a polyimide powder was obtained.

EXAMPLE 8

In the same manner as in Example 1, 5.06 g (0.01 mole) of bis[4-(4-aminophenoxy)phenyl]menthane was dissolved in 49.0 g of NMP, upon which 3.58 g (0.01 mole) of 3,3',4,4'-diphenylsulfone tetracarboxylic dianhydride was added to the solution to prepare a polyamic acid solution, from which a polyimide powder was obtained.

EXAMPLE 9

In the same manner as in Example 1, 5.58 g (0.01 mole) of bis[4-(4-aminophenoxy)-3,5-dimethylphenyl] tricyclo[5,2,1,0$^{2,6}$]decane was dissolved in 174.0 g of NMP, upon which 3.58 g (0.01 mole) of 3,3',4,4'-diphenylsulfone tetracarboxylic dianhydride was added to the solution to prepare a polyamic acid solution, from which a polyimide powder was obtained.

EXAMPLE 10

In the same manner as in Example 1, 5.64 g (0.01 mole) of 1,1-bis[4,(4-aminophenoxy)-3-t-butyl-6-methylphenyl] butane was dissolved in 77.2 g of NMP, upon which 2.94 g (0.01 mole) of 3,3',4,4'-biphenyl tetracarboxylic dianhydride was added to the solution to prepare a polyamic acid solution, from which a polyimide powder was obtained.

EXAMPLE 11

In the same manner as in Example 1, 5.06 g (0.01 mole) of bis[4-(4-aminophenoxy)phenyl]menthane was dissolved in 72.0 g of NMP, upon which 2.94 g (0.01 mole) of 3,3',4,4'-biphenyl tetracarboxylic dianhydride was added to the solution to prepare a polyamic acid solution, from which a polyimide powder was obtained.

EXAMPLE 12

In the same manner as in Example 1, 5.58 g (0.01 mole) of bis[4-(4-aminophenoxy)-3,5-dimethylphenyl] tricyclo[5,2,1,0$^{2,6}$]decane was dissolved in 161.9 g of NMP, upon which 2.95 g (0.01 mole) of 3,3',4,4'-biphenyl tetracarboxylic dianhydride was added to the solution to prepare a polyamic acid solution, from which a polyimide powder was obtained.

EXAMPLE 13

In the same manner as in Example 1, 5.64 g (0.01 mole) of 1,1-bis[4-(4-aminophenoxy)-3-t-butyl-6-methylphenyl] butane was dissolved in 79.7 g of NMP, upon which 3.22 g (0.01 mole) of 3,3',4,4'-benzophenone tetracarboxylic dianhydride was added to the solution to prepare a polyamic acid solution, from which a polyimide powder was obtained.

EXAMPLE 14

In the same manner as in Example 1, 5.06 g (0.01 mole) of bis[4-(4-aminophenoxy)phenyl]menthane was dissolved in 74.5 g of NMP, upon which 3.22 g (0.01 mole) of 3,3',4,4'-benzophenone tetracarboxylic dianhydride was added to the solution to prepare a polyamic acid solution, from which a polyimide powder was obtained.

EXAMPLE 15

In the same manner as in Example 1, 5.58 g (0.01 mole) of bis[4-(4-aminophenoxy)-3,5-dimethylphenyl] tricyclo[5,2,1,0$^{2,6}$]decane was dissolved in 167.2 g of m-cresol, upon which 3.22 g (0.01 mole) of 3,3',4,4'-benzophenone tetracarboxylic dianhydride was added to the solution, to prepare a polyamic acid solution, from which a polyimide powder was obtained.

EXAMPLE 16

In the same manner as in Example 1, 5.64 g (0.01 mole) of 1,1-bis[4-(4-aminophenoxy)-3-t-butyl-6-methylphenyl] butane was dissolved in 70.4 g of NMP, upon which 2.18 g (0.01 mole) of pyromellitic dianhydride was added to the solution to prepare a polyamic acid solution, from which a polyimide powder was obtained.

EXAMPLE 17

In the same manner as in Example 1, 5.06 g (0.01 mole) of bis[4-(4-aminophenoxy)phenyl]menthane was dissolved in 65.2 g of NMP, upon which 2.18 g (0.01 mole) of pyromellitic dianhydride was added to the solution to prepare a polyamic acid solution, from which a polyimide powder was obtained.

EXAMPLE 18

In the same manner as in Example 1, 5.58 g (0.01 mole) of bis[4-(4-aminophenoxy)-3,5-dimethylphenyl] tricyclo[5,2,1,0$^{2,6}$]decane was dissolved in 147.4 g of NMP, upon which 2.18 g (0.01 mole) of pyromellitic dianhydride was added to the solution to prepare a polyamic acid solution, from which a polyimide powder was obtained.

COMPARATIVE EXAMPLE 1

In the same manner as in Example 1, 5.18 g (0.01 mole) of 2,2-bis[4-(4-aminophenoxy)phenyl] hexafluoropropane was dissolved in 78.8 g of NMP, upon which 3.58 g (0.01 mole) of 3,3',4,4'-diphenylsulfone tetracarboxylic dianhydride was added to the solution to prepare a polyamic acid solution, from which a polyimide powder was obtained.

COMPARATIVE EXAMPLE 2

In the same manner as in Example 1, 2.00 g (0.01 mole) of bis(4-aminophenyl) ether was dissolved in 23.7 g of NMP, upon which 2.18 g (0.01 mole) of pyromellitic dianhydride was added to the solution, and the resulting polyamic acid solution was cast onto a glass plate and dried at 100° C. overnight under reduced pressure, and thereafter heated at 200° C. for one hour under reduced pressure and then at 300° C. for one hour under ventilation to obtain a polyimide film.

EXAMPLE 19

Figure 2:
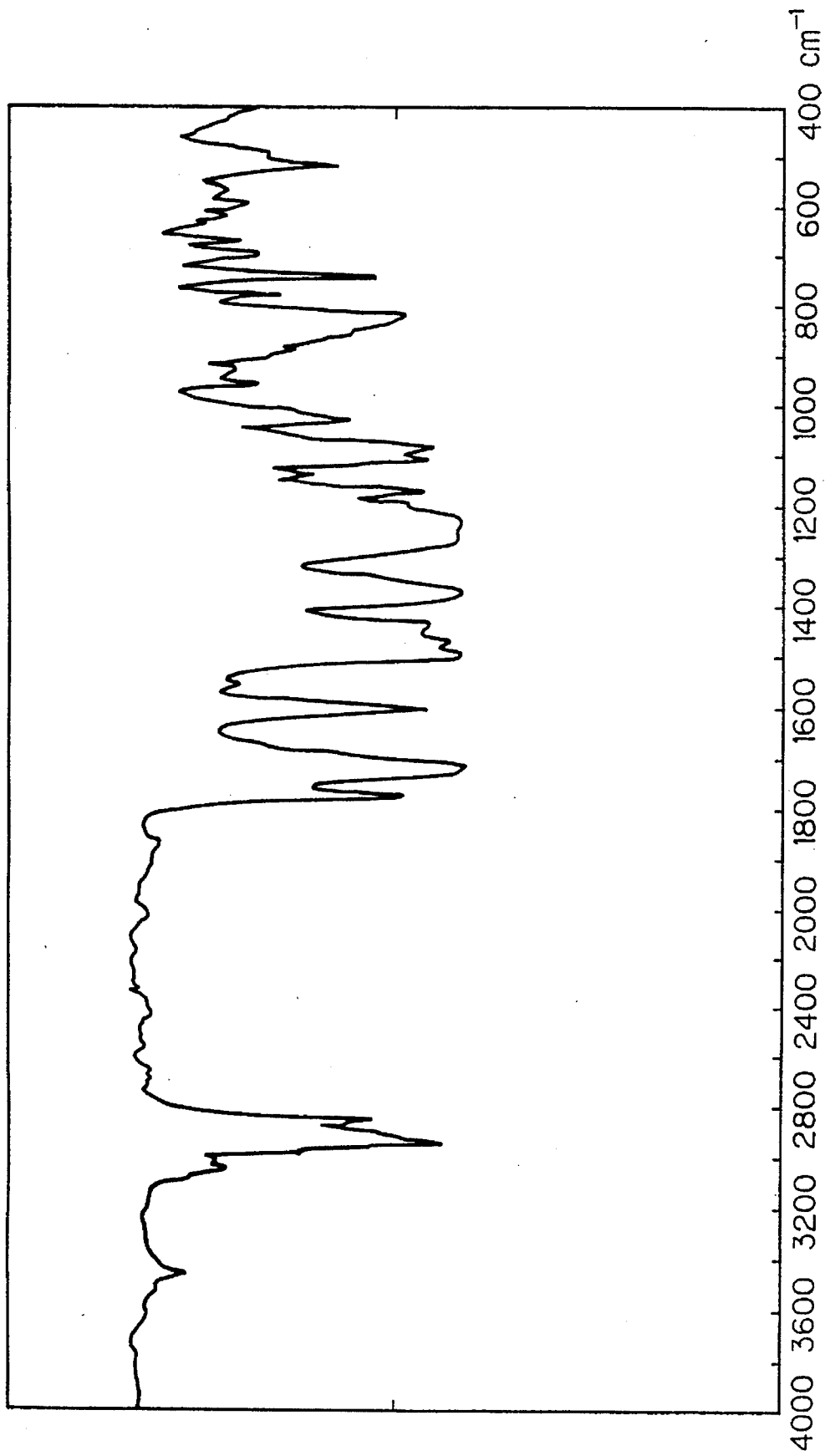
FIG. 2 shows an infrared absorption spectrum of the polyimide of this invention obtained in Example 2.
Figure 3:
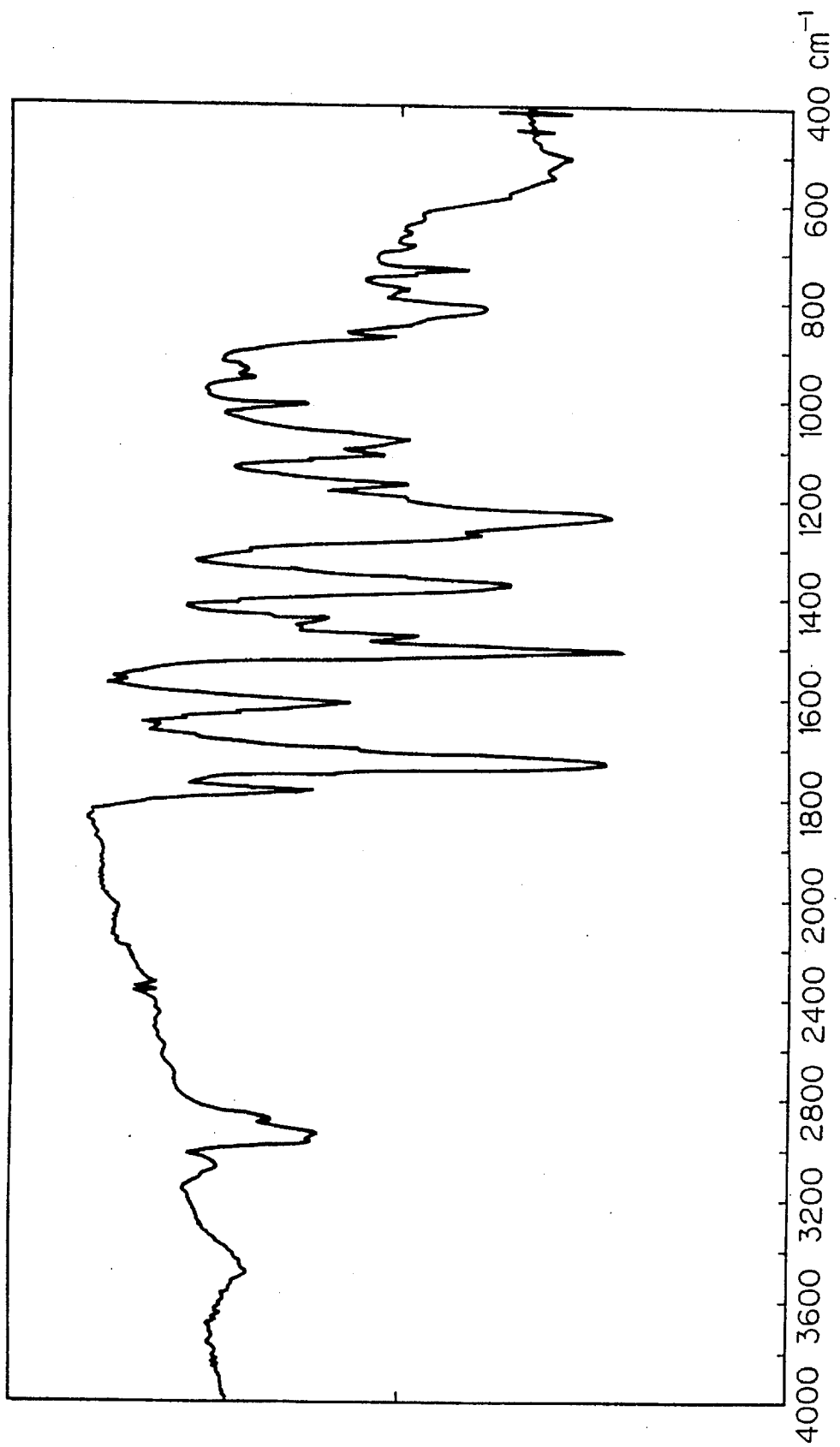
FIG. 3 shows an infrared absorption spectrum of the polyimide of this invention obtained in Example 3.
Figure 4:
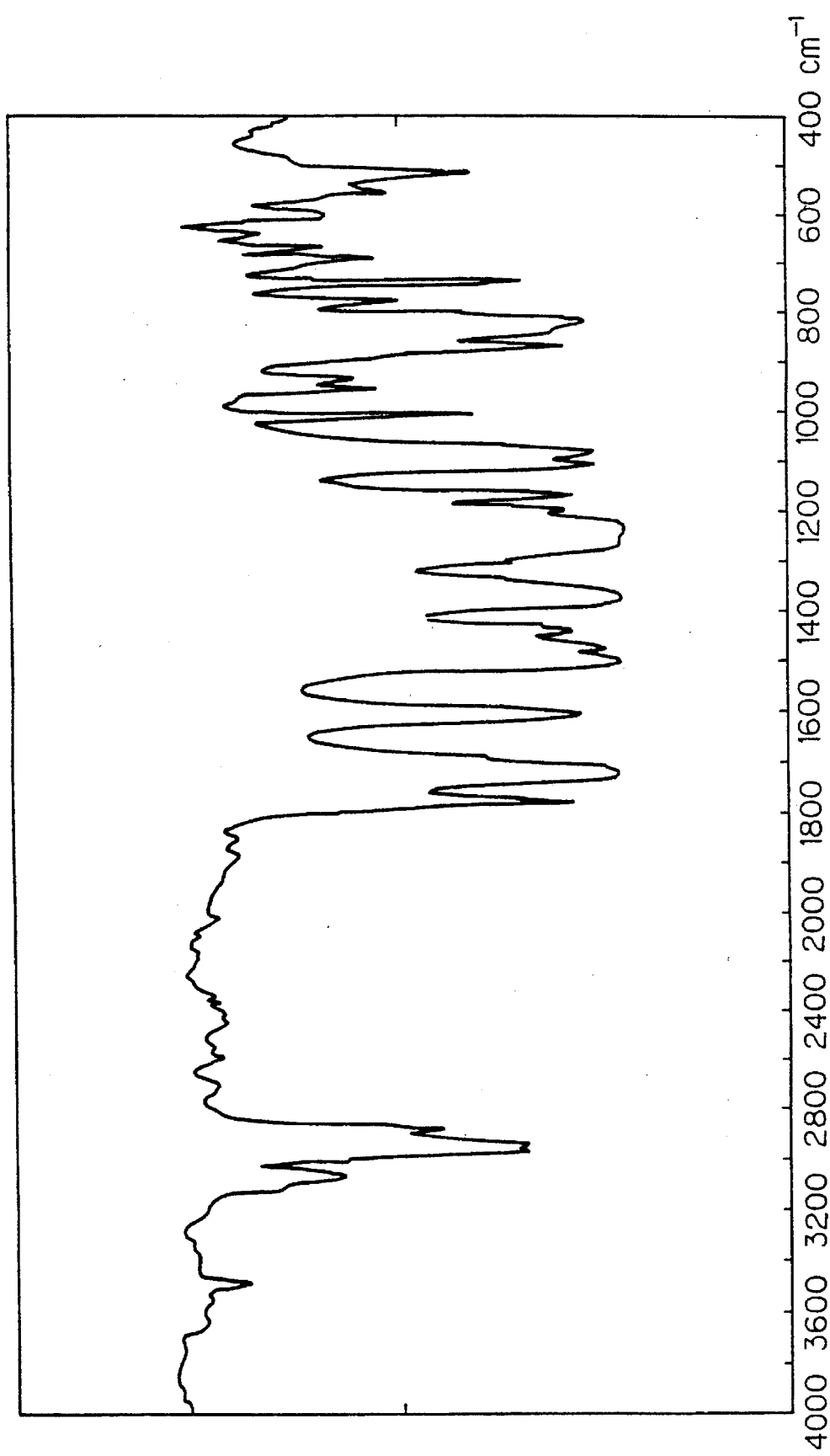
FIG. 4 shows an infrared absorption spectrum of the polyimide of this invention obtained in Example 4.
Figure 5:
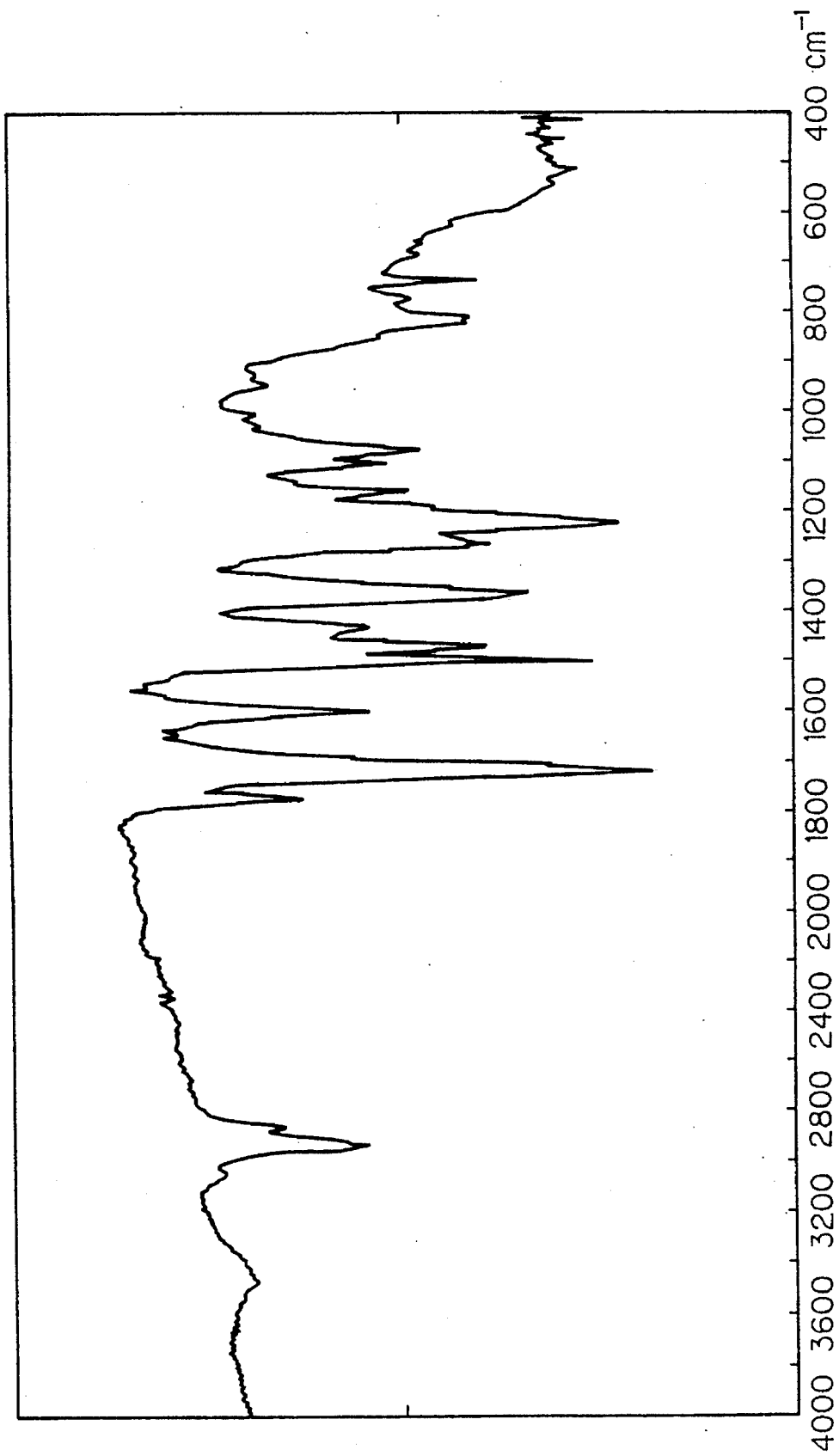
FIG. 5 shows an infrared absorption spectrum of the polyimide of this invention obtained in Example 5.
Figure 6:
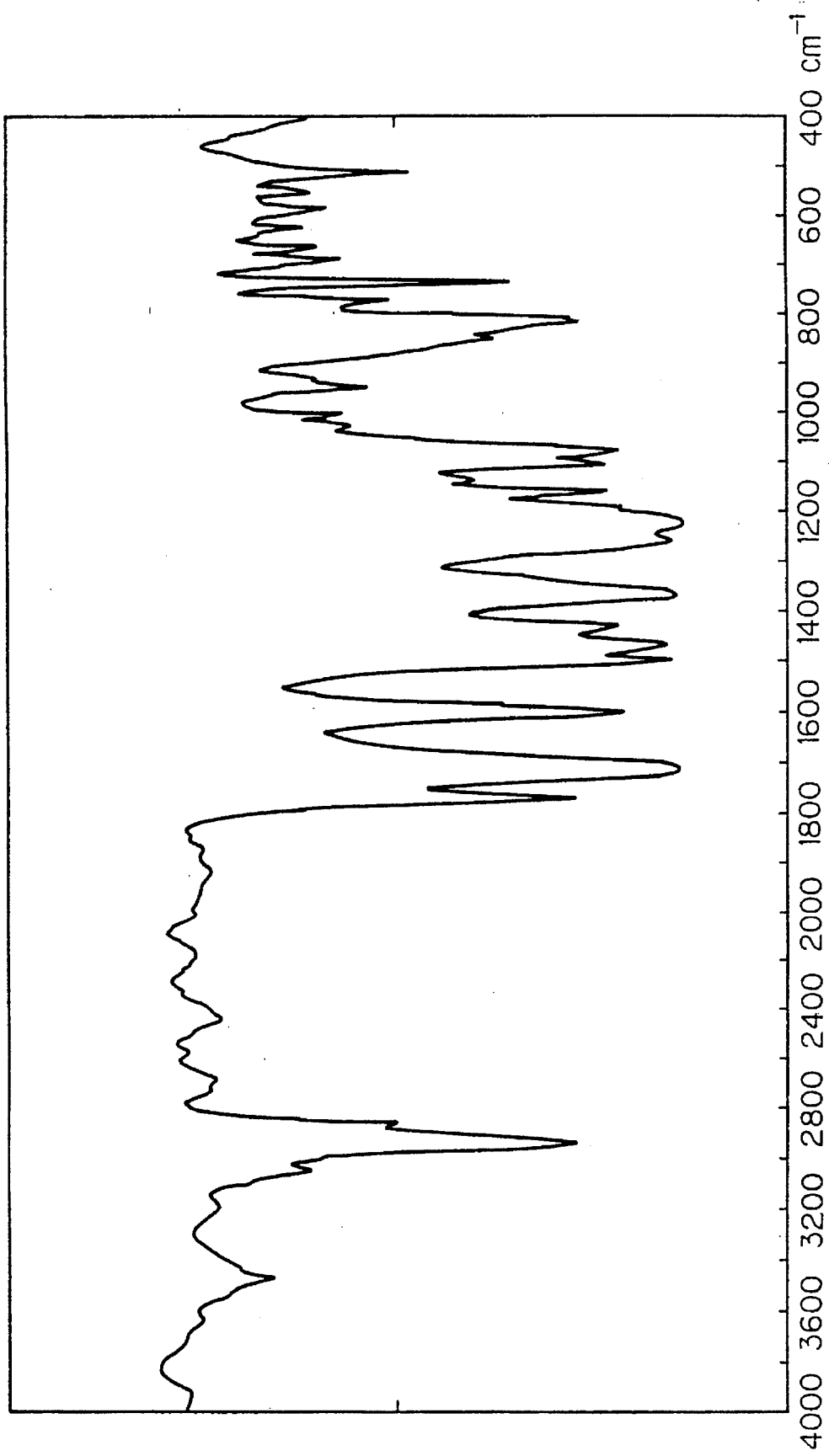
FIG. 6 shows an infrared absorption spectrum of the polyimide of this invention obtained in Example 6.
Figure 7:
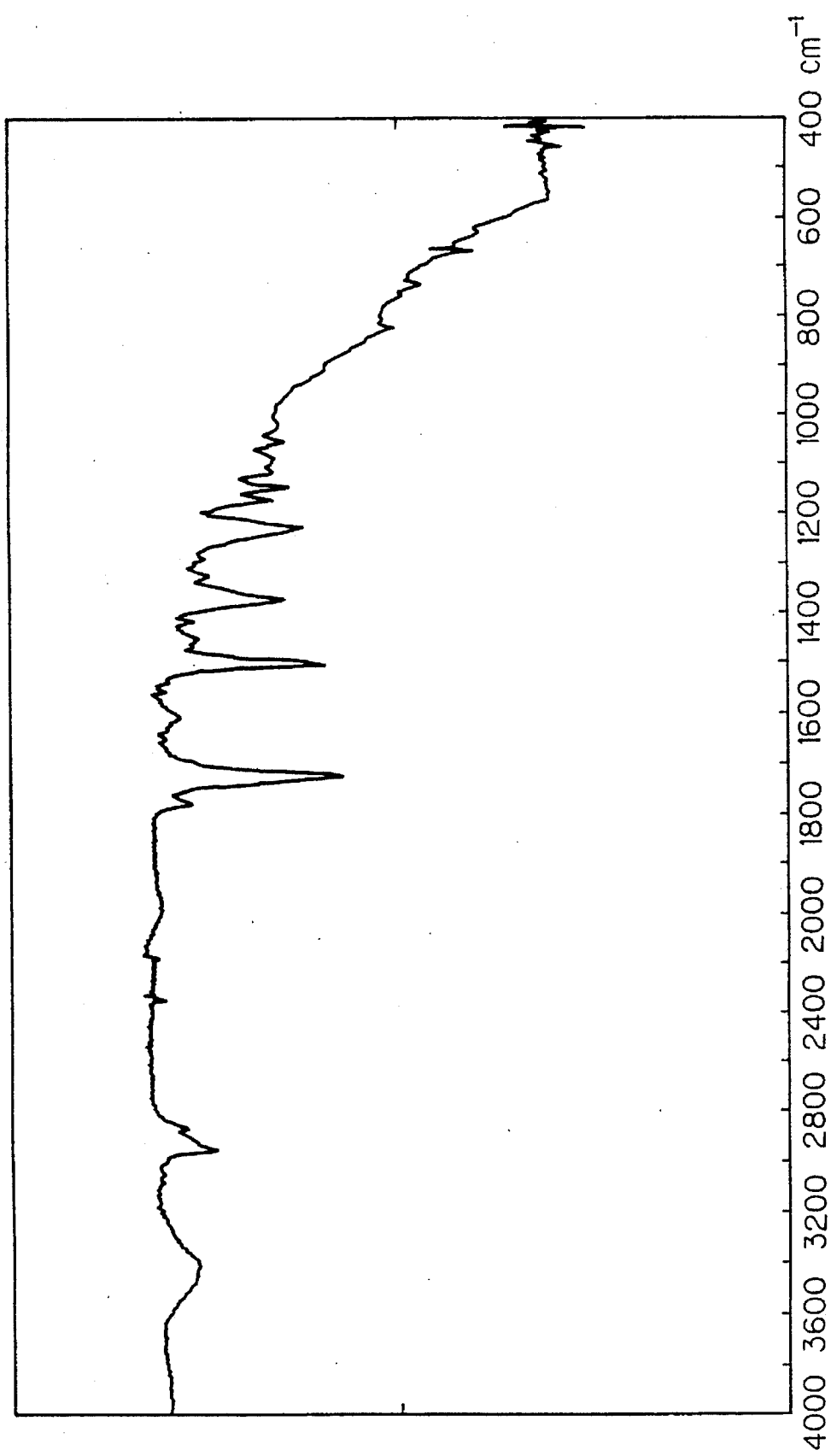
FIG. 7 shows an infrared absorption spectrum of the polyimide of this invention obtained in Example 7.
Figure 8:
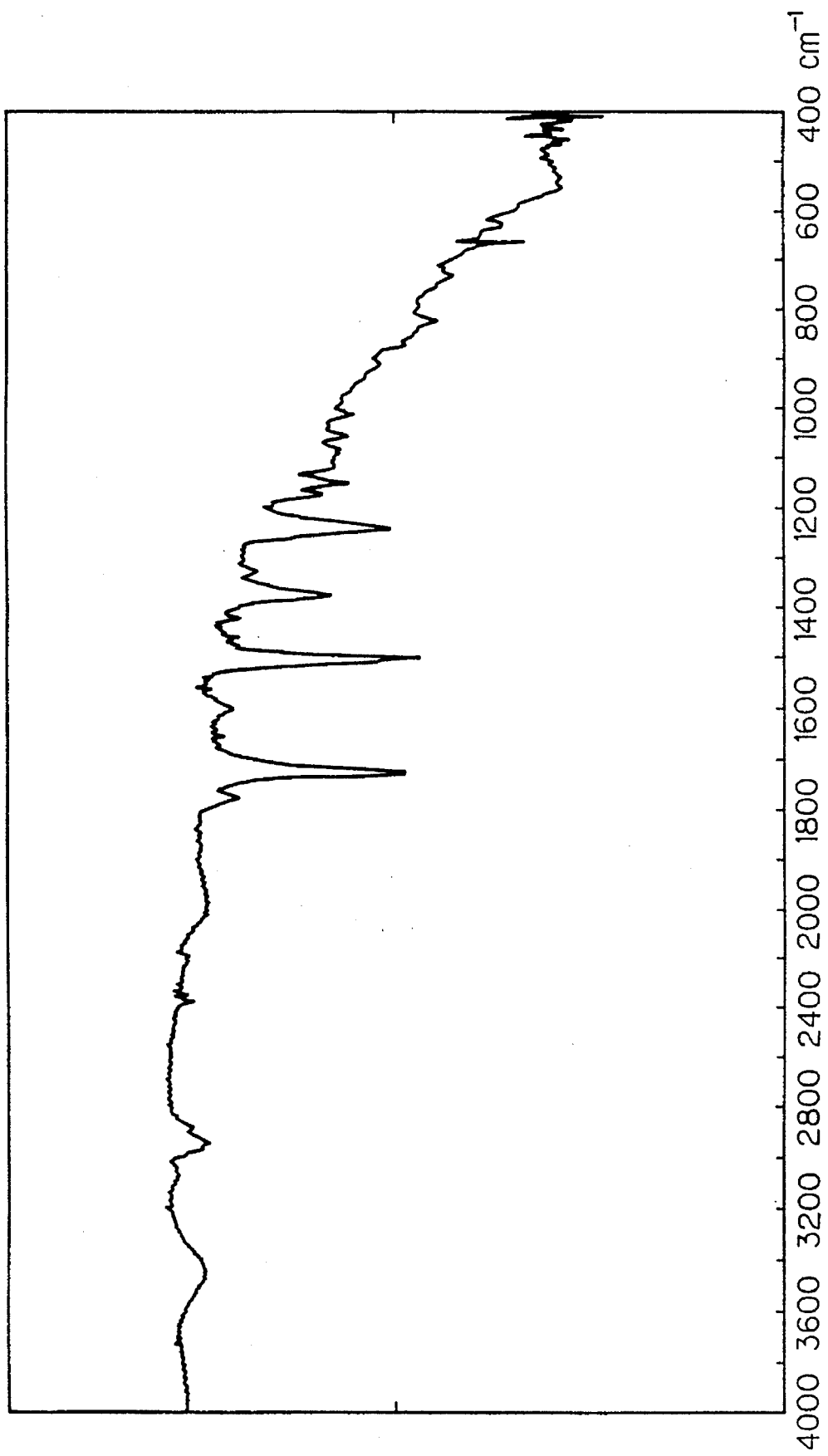
FIG. 8 shows an infrared absorption spectrum of the polyimide of this invention obtained in Example 8.
Figure 9:
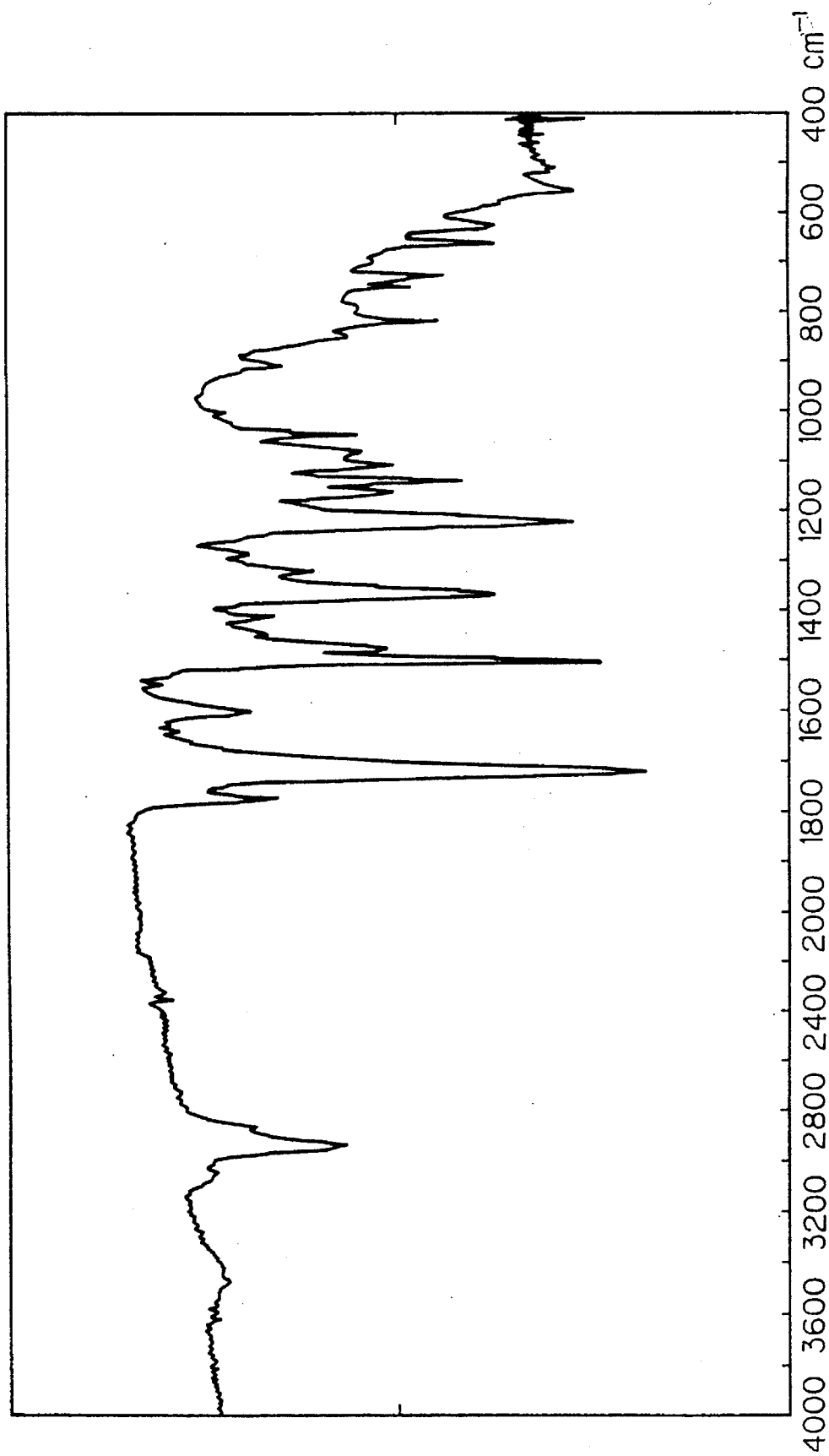
FIG. 9 shows an infrared absorption spectrum of the polyimide of this invention obtained in Example 9.
Figure 10:
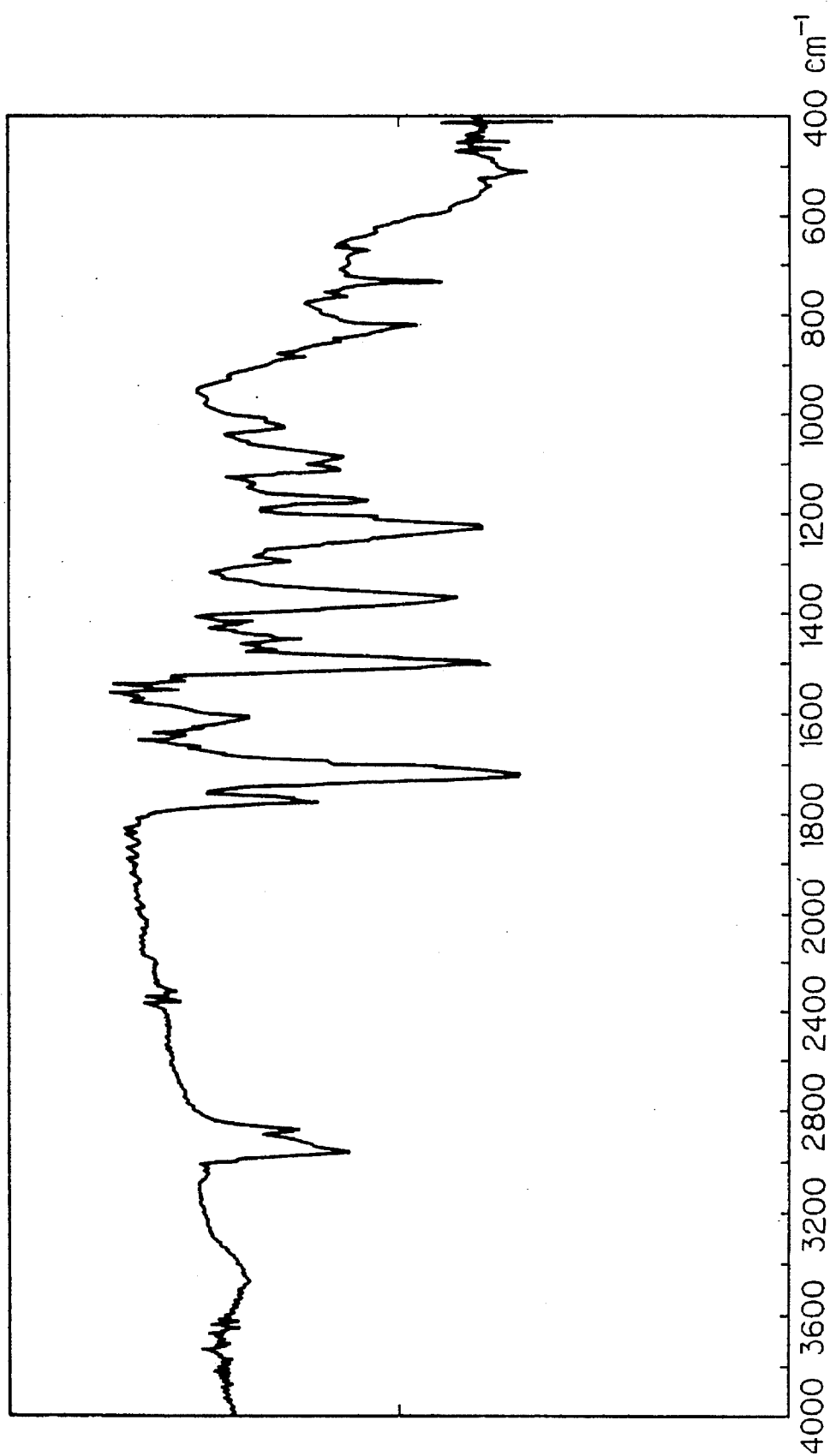
FIG. 10 shows an infrared absorption spectrum of the polyimide of this invention obtained in Example 10.
Figure 11:
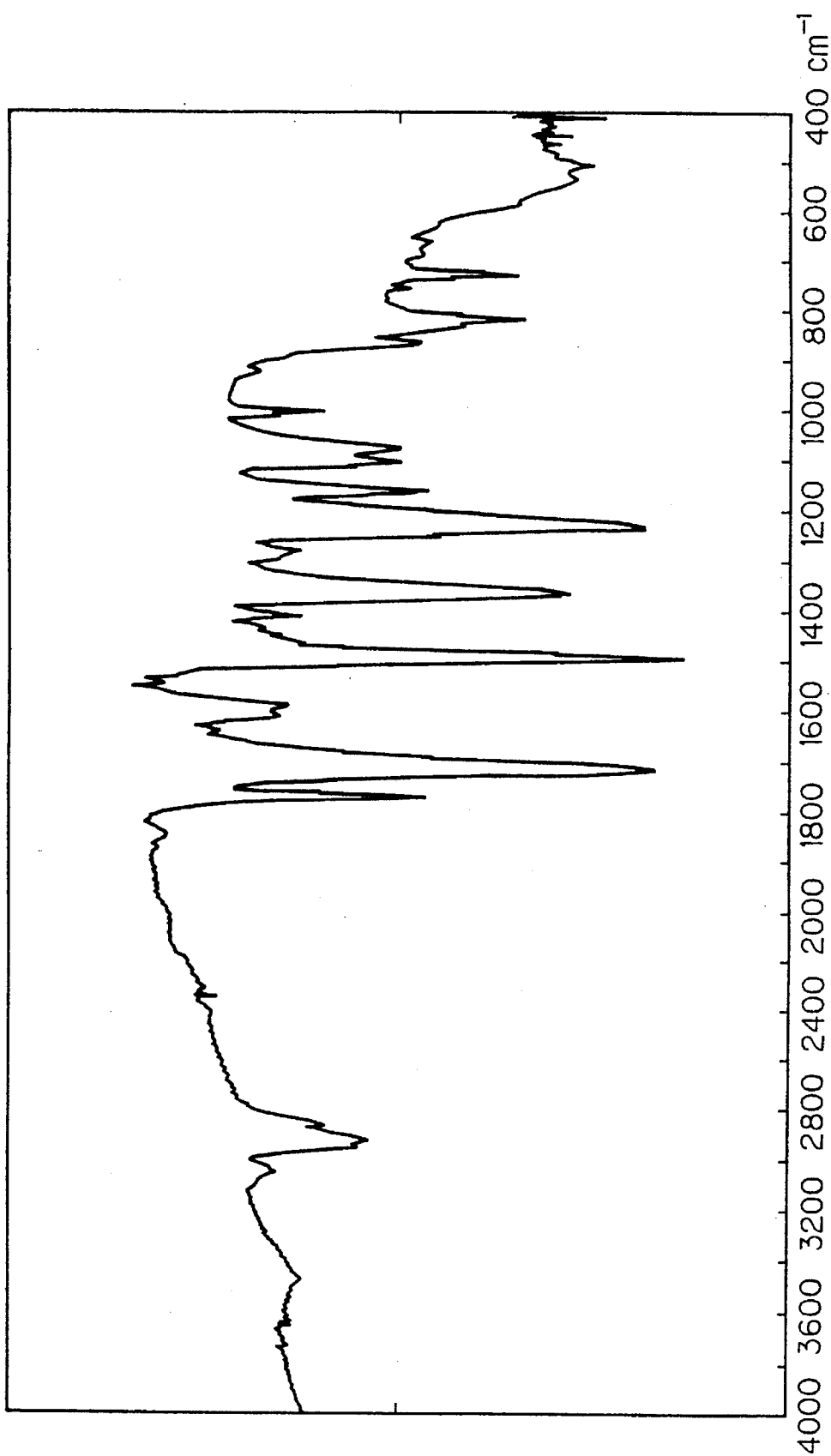
FIG. 11 shows an infrared absorption spectrum of the polyimide of this invention obtained in Example 11.
Figure 12:
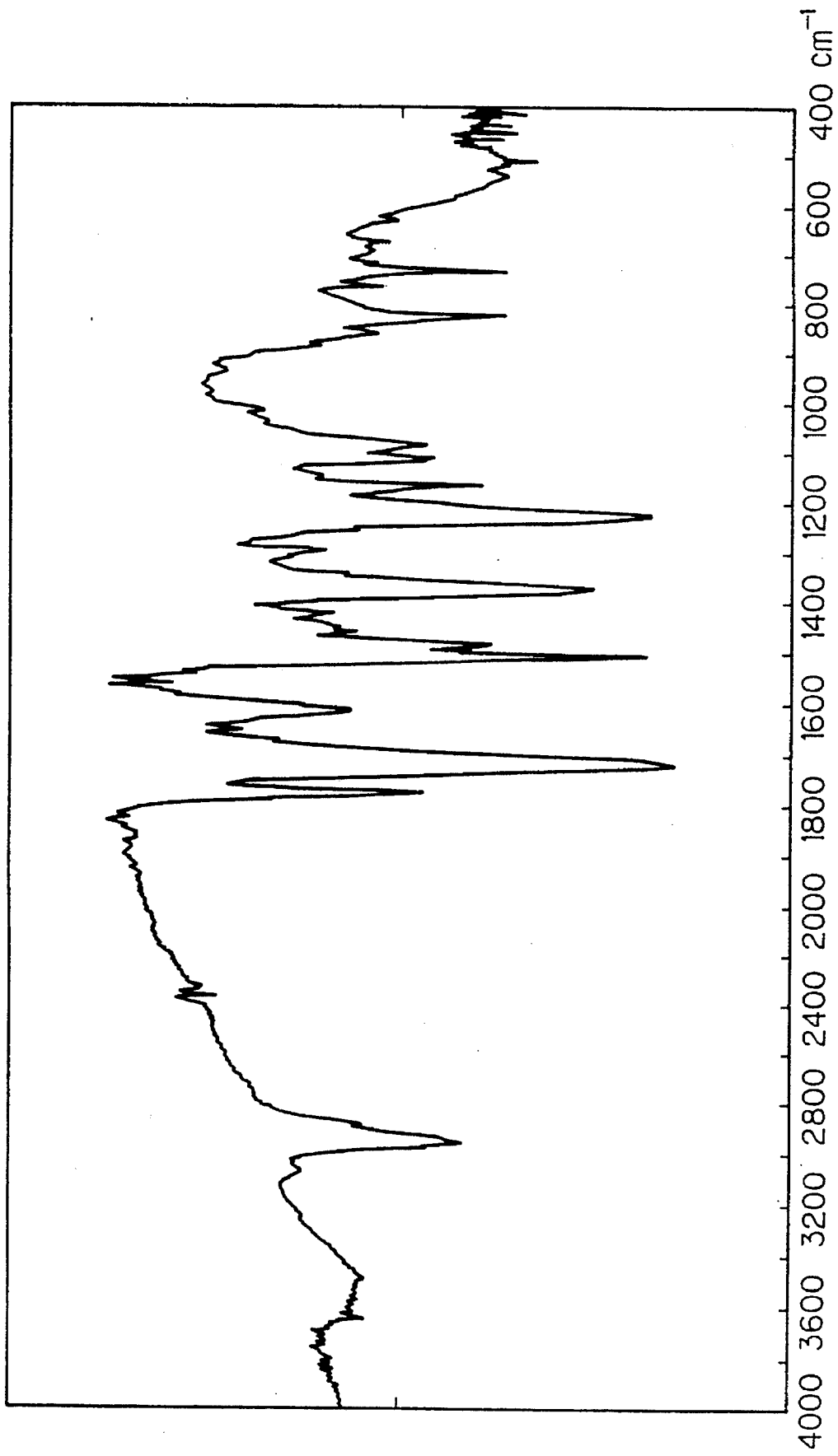
FIG. 12 shows an infrared absorption spectrum of the polyimide of this invention obtained in Example 12.
Figure 13:
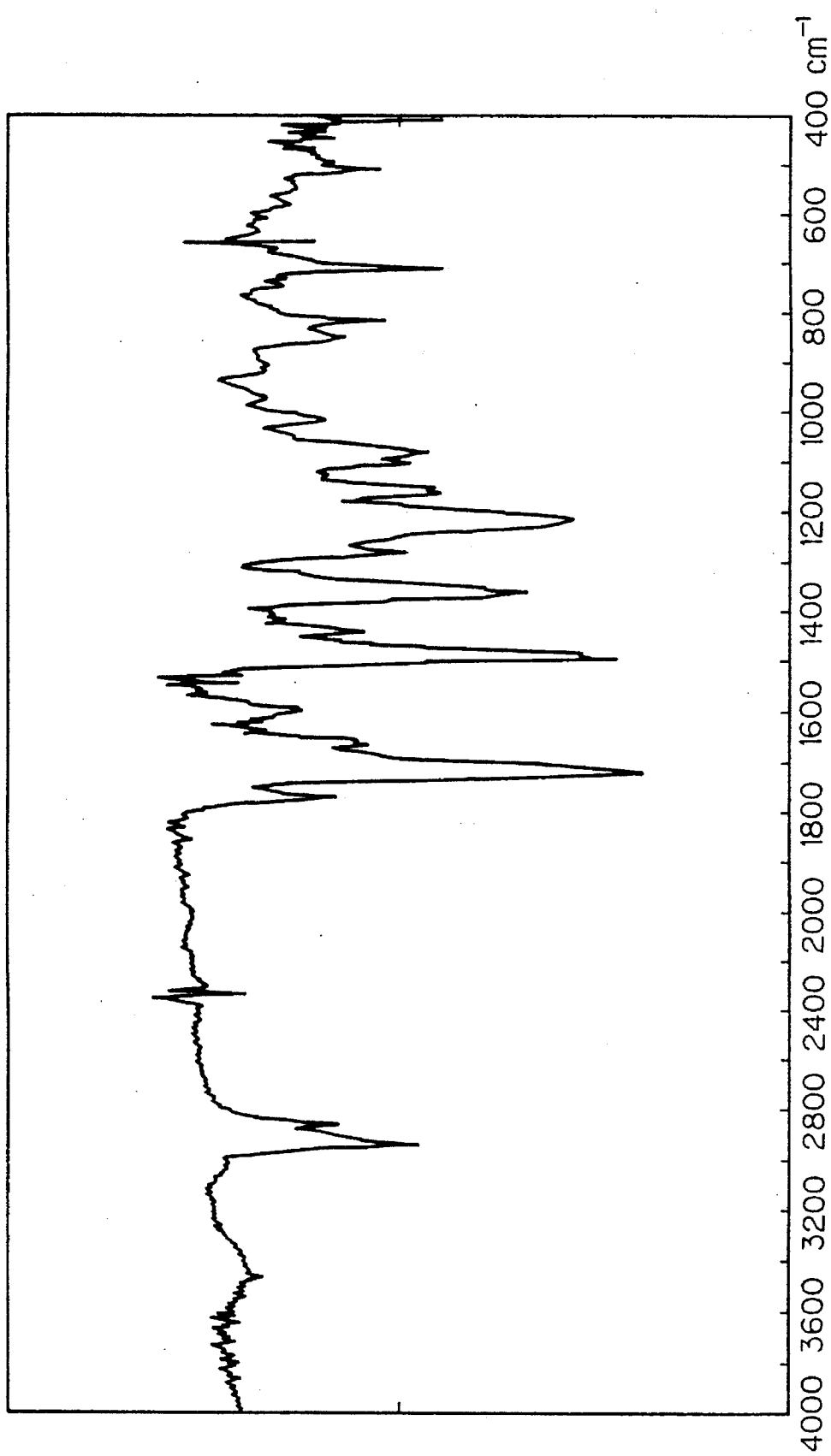
FIG. 13 shows an infrared absorption spectrum of the polyimide of this invention obtained in Example 13.
Figure 14:
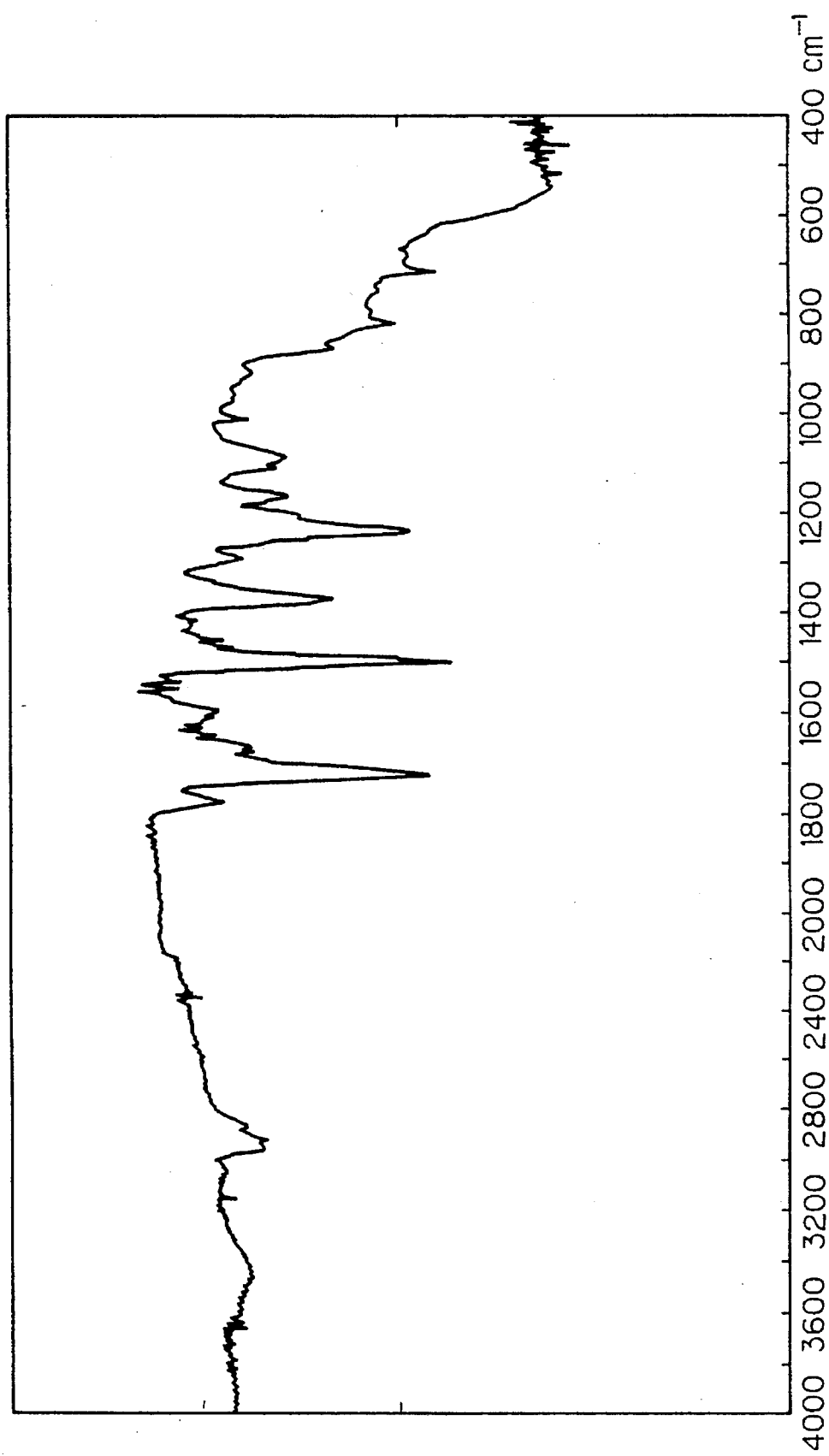
FIG. 14 shows an infrared absorption spectrum of the polyimide of this invention obtained in Example 14.
Figure 15:
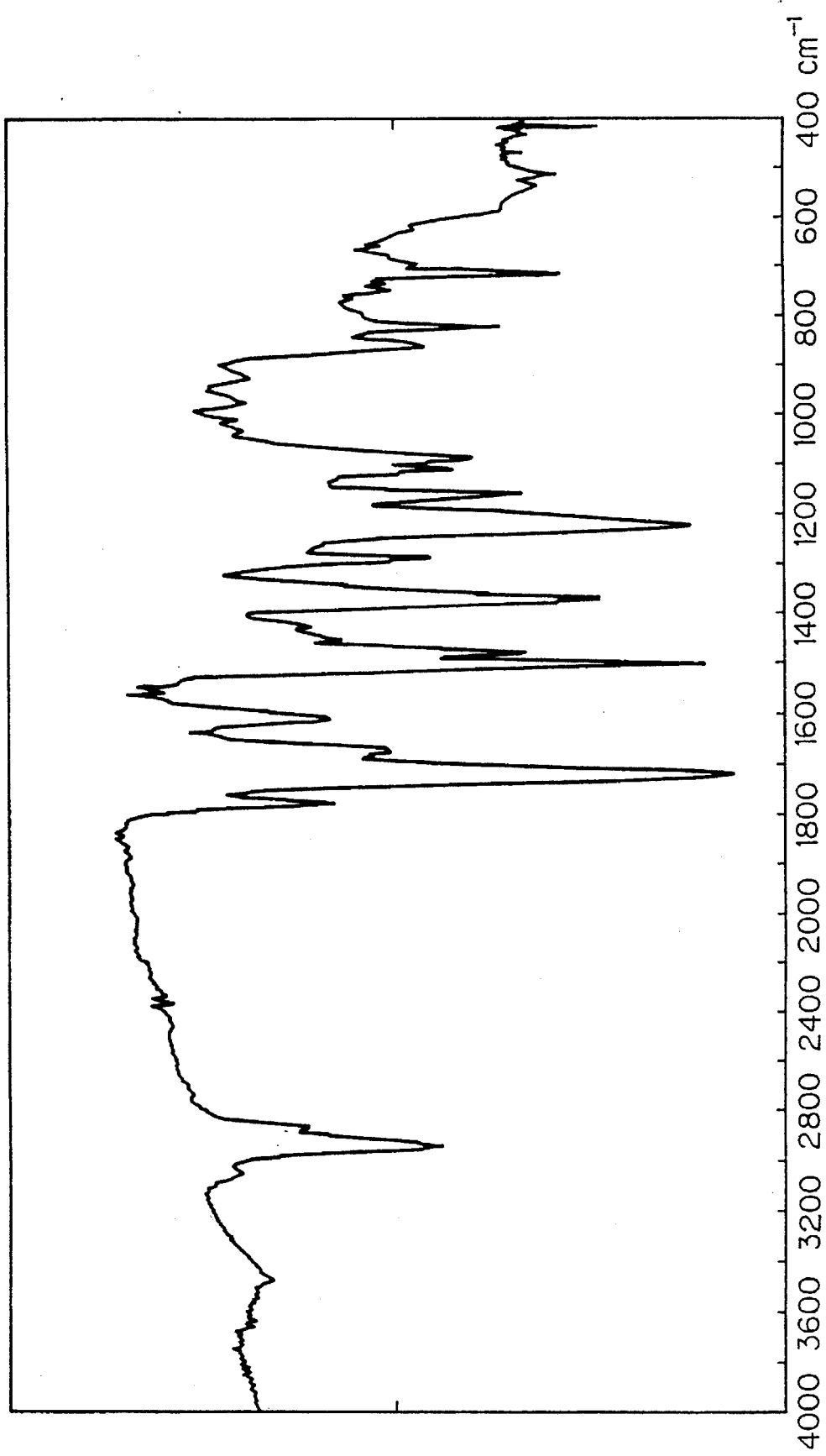
FIG. 15 shows an infrared absorption spectrum of the polyimide of this invention obtained in Example 15.
Figure 16:
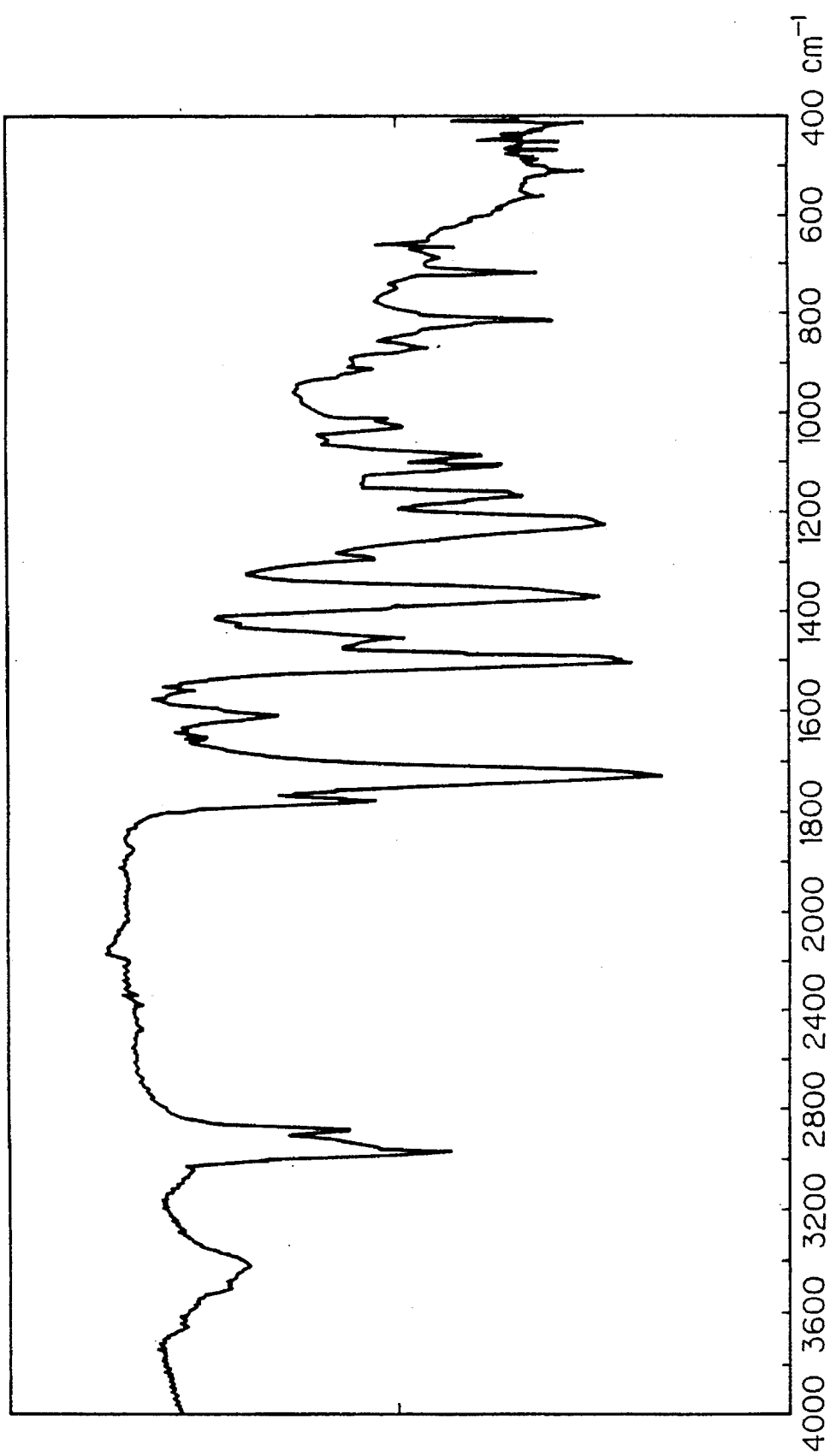
FIG. 16 shows an infrared absorption spectrum of the polyimide of this invention obtained in Example 16.
Figure 17:
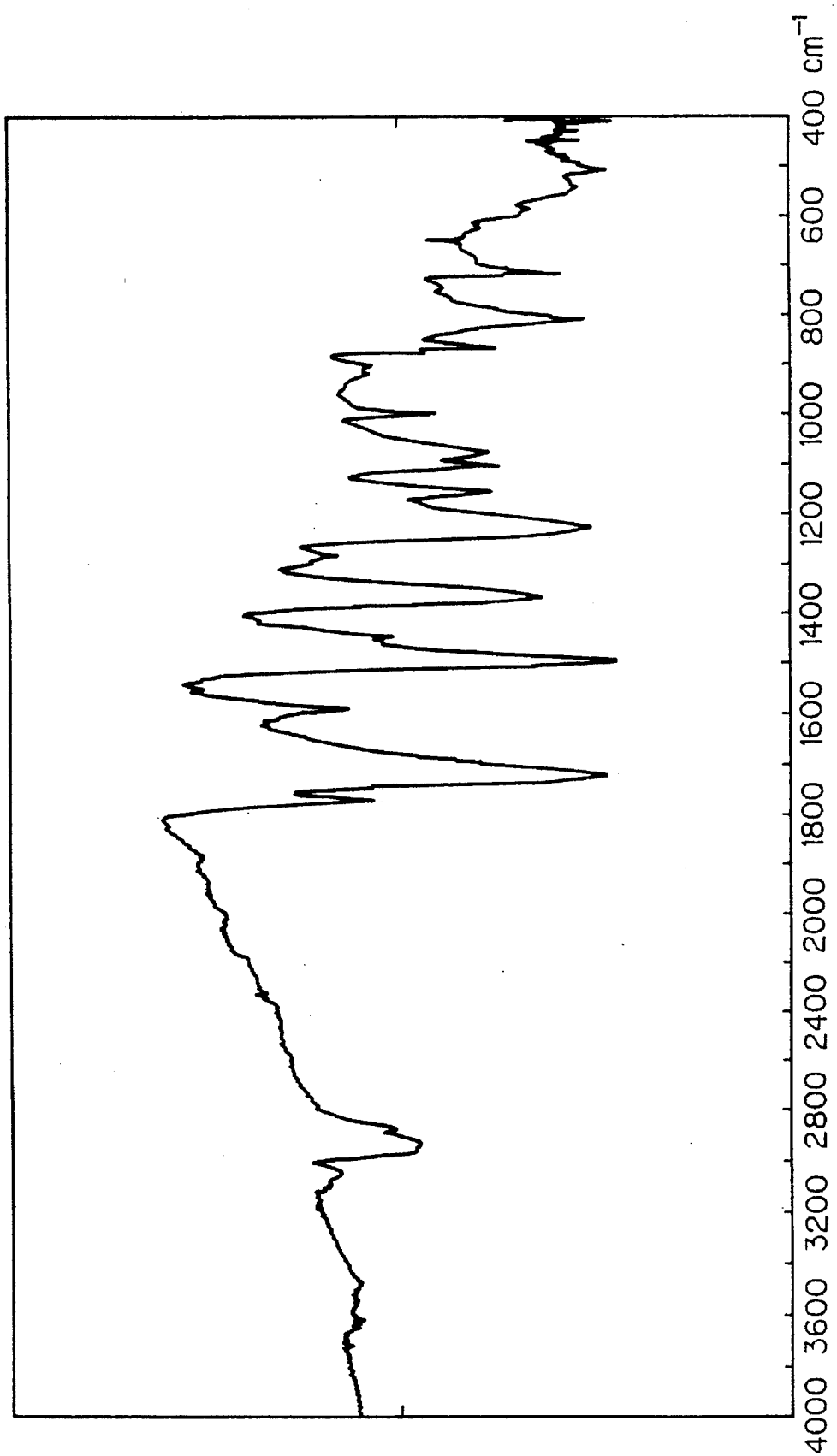
FIG. 17 shows an infrared absorption spectrum of the polyimide of this invention obtained in Example 17.
Figure 18:
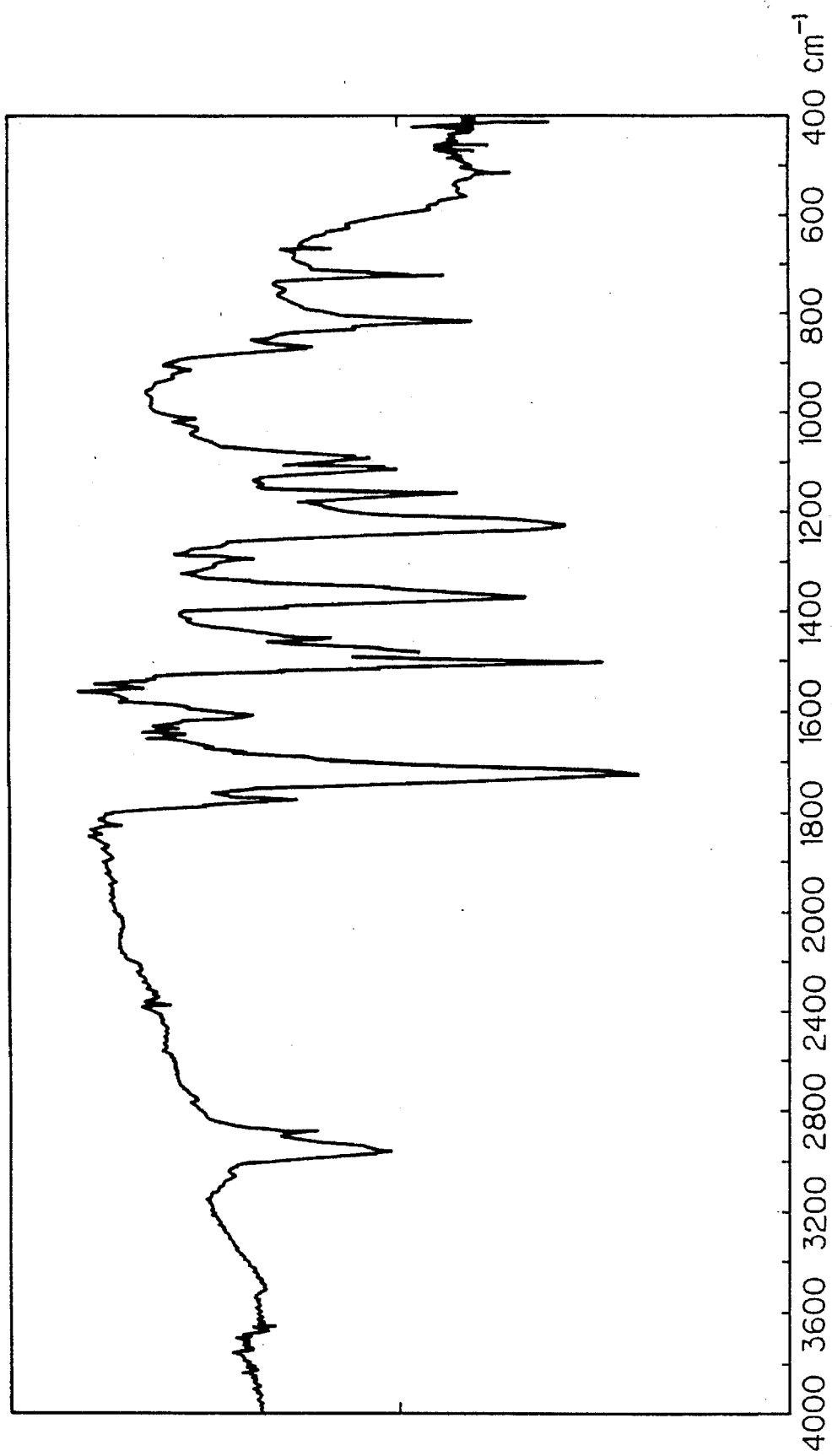
FIG. 18 shows an infrared absorption spectrum of the polyimide of this invention obtained in Example 18.
Figure 19:
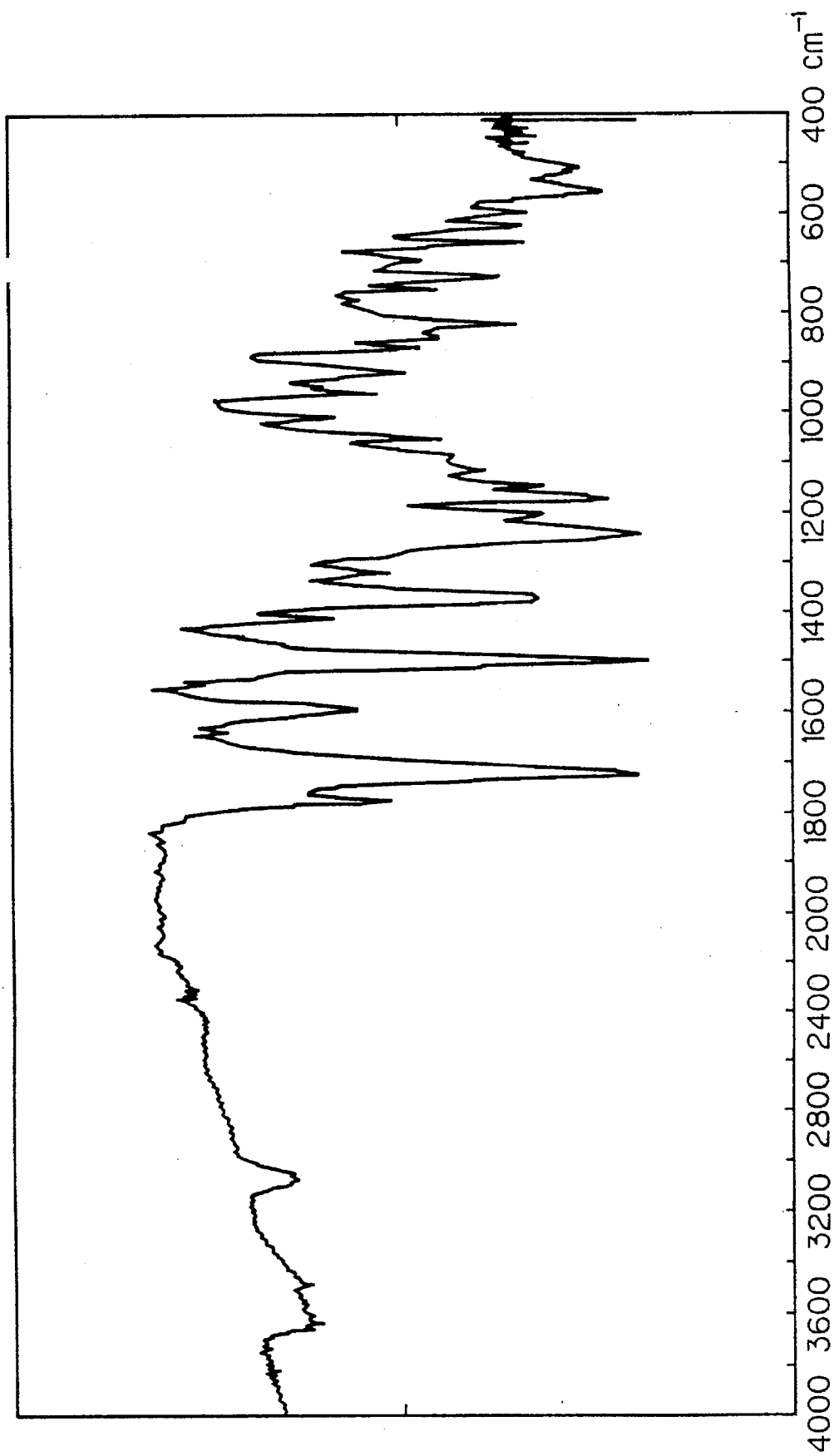
FIG. 19 shows an infrared absorption spectrum of the polyimide obtained in Comparative Example 1.
Figure 20:
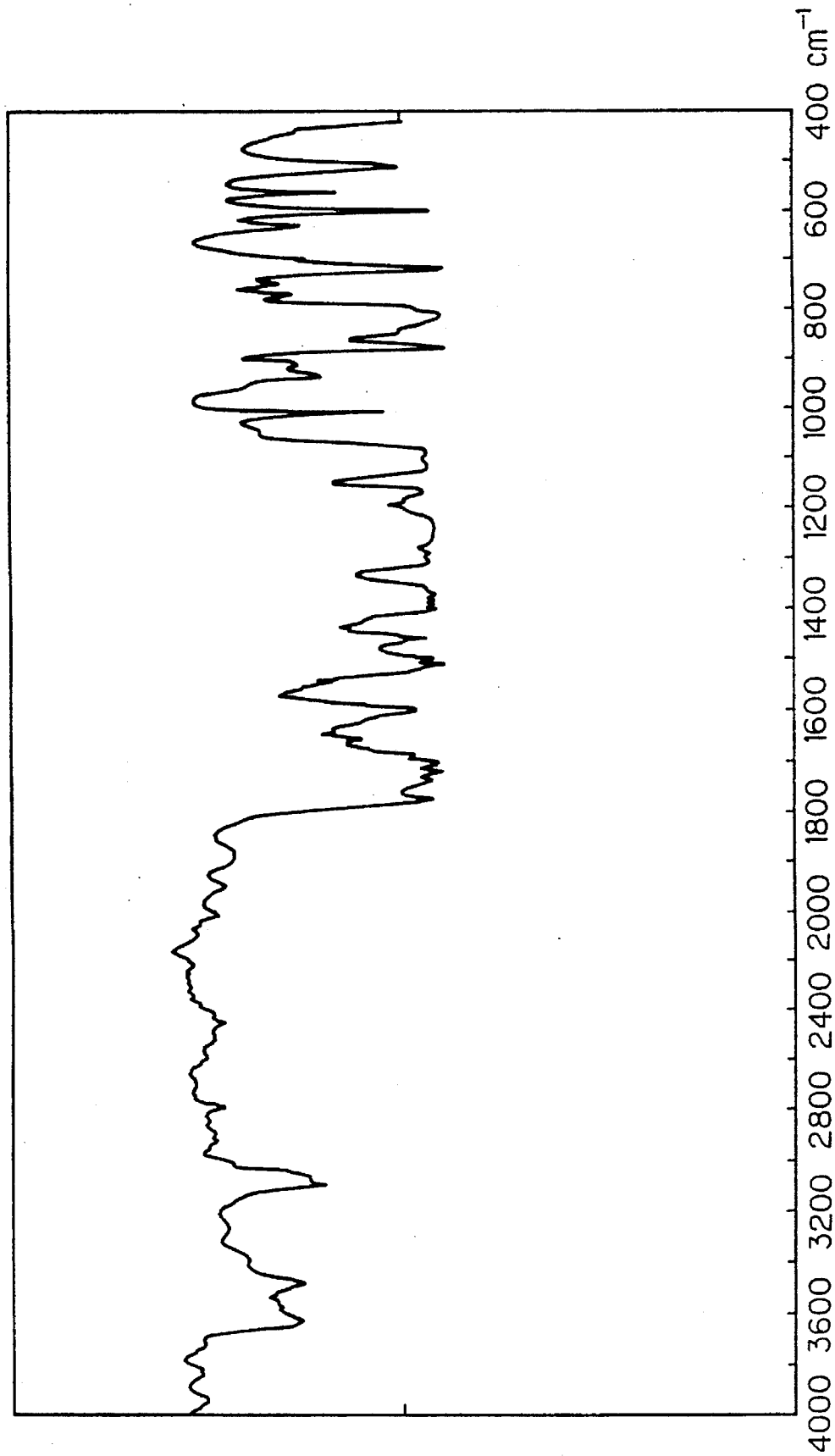
FIG. 20 shows an infrared absorption spectrum of the polyimide obtained in Comparative Example 2.

The polyimide powders and polyimide films obtained in Examples 1 to 18 and Comparative Examples 1 and 2 were subjected to measurement of infrared absorption spectrum to obtain the results shown in FIGS. 1 to 20. In each of FIGS. 1 to 20, absorption was observed in the vicinity of 1720 cm$^{-1}$ and 1780 cm$^{-1}$ which are the characteristic absorption region of a five-membered ring imide group.

In Table 1, the results of measurement of solubilities of the polyimides obtained in Examples 1 to 18 and Comparative Examples 1 and 2 are shown.

TABLE 1

| | Solubility of polyimide | | | | | |
|---|---|---|---|---|---|---|
| | Solubility | | | | | |
| | m-Cresol | NMP | DMAc | DMF | THF | Chloroform |
| Example 1 | ++ | ++ | ++ | ++ | ++ | ++ |
| Example 2 | ++ | ++ | ++ | ++ | ++ | ++ |
| Example 3 | ++ | ++ | ++ | ++ | ++ | ++ |
| Example 4 | + | + | ± | ± | ± | + |
| Example 5 | + | + | + | + | + | + |
| Example 6 | ± | ± | ± | ± | ± | ± |
| Example 7 | ++ | ++ | ++ | ++ | ++ | ++ |
| Example 8 | ++ | ++ | ++ | ++ | ++ | ++ |
| Example 9 | ++ | ++ | ++ | ++ | ++ | ++ |
| Example 10 | ++ | ++ | ++ | ++ | ++ | ++ |
| Example 11 | ++ | ++ | ++ | ++ | ++ | ++ |
| Example 12 | + | + | ± | ± | + | + |
| Example 13 | + | + | + | + | + | + |
| Example 14 | ++ | ++ | ± | ± | ± | + |
| Example 15 | + | + | + | ± | + | + |
| Example 16 | ++ | ++ | ++ | ++ | ++ | ++ |
| Example 17 | + | + | ± | ± | ± | + |
| Example 18 | ++ | + | ± | ± | ± | + |
| Comp. Ex. 1 | ++ | ++ | ++ | ++ | ++ | ++ |
| Comp. Ex. 2 | − | − | − | − | − | − |

Note:
++: Dissolved at room temperature.
+: Dissolved at 150° C.
±: Partially dissolved.
−: Not dissolved.

EXAMPLE 20

Each of the polyimide powders obtained in Examples 1, 3, 5 and 7 to 18 and Comparative Example 1 was compression molded under the conditions of 300° C. and 50 kg/cm$^2$ into disks each having a diameter of about 1.8 cm and a thickness of about 1 mm and the disks were subjected to measurement of thermal characteristics and electric characteristics to obtain the results shown in Table 2. In addition, in Table 2, the results of measurement of the two characteristics of the polyimide film obtained in Comparative Example 2 are shown. From these measurement results, it can be seen that the polyimide of this invention have both low dielectric properties and excellent solubility in various solvents.

TABLE 2

| | Thermal and electric characteristics of polyimide | | | |
|---|---|---|---|---|
| | Td (°C.) TG-DTA | Tg (°C.) DSC | ε (1 MHz) | tan δ (1 MHz) |
| Example 1 | 459.8 | 239.4 | 2.85 | 0.002 |
| Example 3 | 463.8 | 242.2 | 2.96 | 0.001 |
| Example 5 | 462.7 | 255.1 | 2.95 | 0.003 |

TABLE 2-continued

Thermal and electric characteristics of polyimide

| | Td (°C.) TG-DTA | Tg (°C.) DSC | ε (1 MHz) | tan δ (1 MHz) |
|---|---|---|---|---|
| Example 7 | 406.7 | 249.1 | 2.80 | 0.003 |
| Example 8 | 405.8 | 249.9 | 2.99 | 0.002 |
| Example 9 | 426.2 | 252.2 | 2.94 | 0.003 |
| Example 10 | 463.5 | 248.1 | 2.91 | 0.002 |
| Example 11 | 458.8 | 236.7 | 3.02 | 0.002 |
| Example 12 | 464.2 | 297.2 | 2.93 | 0.003 |
| Example 13 | 458.2 | 245.2 | 2.93 | 0.002 |
| Example 14 | 461.9 | 242.0 | 3.03 | 0.003 |
| Example 15 | 448.0 | 252.6 | 2.97 | 0.003 |
| Example 16 | 460.3 | 290.8 | 2.91 | 0.004 |
| Example 17 | 461.5 | 304.0 | 2.98 | 0.003 |
| Example 18 | 455.6 | 288.4 | 3.02 | 0.004 |
| Comp. Ex. 1 | 451.4 | 294.7 | 3.20 | 0.003 |
| Comp. Ex. 2 | 594.0 | 420.0 | 3.57 | 0.010 |

What is claimed is:

1. A polyimide represented by the general formula (1):

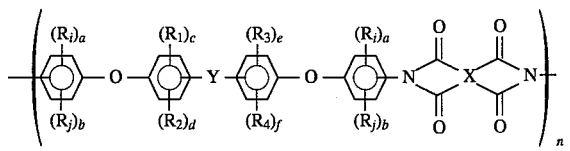

wherein Y represents a hydrocarbon group having 4 to 20 carbon atoms or atom; each of $R_1$ to $R_4$, $R_i$ and $R_j$ represents a halogen atom, or a hydrocarbon group having 1 to 6 carbon atoms when the hydrocarbon group represents alkylidene group, any one of $(R_1)_c$ and $(R_2)_d$, and any one of $(R_3)_e$ and $(R_4)_f$ is a halogen atom or a hydrocarbon group having 4 to 6 carbon atoms; each of a, b, c, d, e and f represents an integer of 0 to 4 satisfying a+b≦4, c+d≦4 and e+f≦4; and X represents a tetravalent organic group having 2 or more carbon atoms.

2. The polyimide according to claim 1, wherein Y represents a sulfur atom, an alkylidene group having 4 to 14 carbon atoms or a phenylalkylidene group having 7 to 20 carbon atoms.

3. The polyimide according to claim 1, wherein $R_1$ and $R_3$ are tertiary butyl groups; c and e are integers of 1 to 4; Y represents a sulfur atom or a butylidene group.

4. The polyimide according to claim 3, wherein $R_1$ and $R_3$ are tertiary butyl groups and c and e are 1.

5. The polyimide according to claim 1, wherein Y is an alicyclic ring structure-containing hydrocarbon group having 5 to 20 carbon atoms.

6. The polyimide according to claim 5, wherein Y is a group represented by one of the formulas (a) to (f):

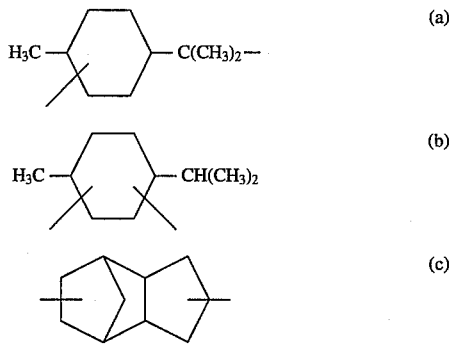

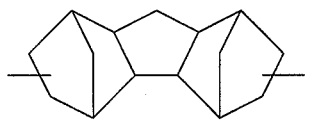

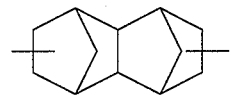

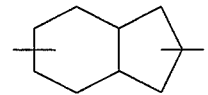

7. The polyimide according to claim 6, wherein Y is a group represented by the formula (a), (b) or (c):

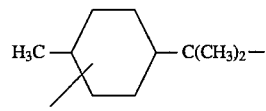

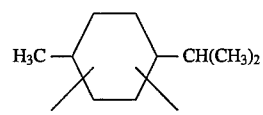

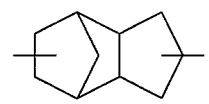

8. The polyimide according to claim 4, wherein the imido group is in the para-position to the ethereal oxygen atom.

9. The polyimide according to claim 7, wherein Y is a group represented by the formula (a), (b) or (c) and the imido group is in the para-position to the ethereal oxygen atom.

10. A process for producing a polyimide, which comprises reacting in an organic solvent an aromatic diamino compound represented by the general formula (2):

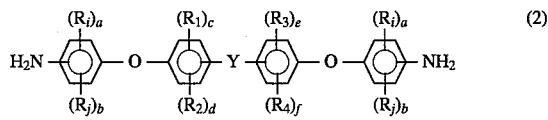

wherein Y represents a hydrocarbon group having 4 to 20 carbon atoms or a sulfur atom; each of $R_1$ to $R_4$, $R_i$ and $R_j$ represents a halogen atom, a hydrocarbon group having 1 to 6 carbon atoms or a halogen-containing hydrocarbon group having 1 to 6 carbon atoms; each of a, b, c, d, e and f represents an integer of 0 to 4 satisfying a+b≦ 4, c+d≦4 and e+f≦4; and X represents a tetravalent organic group having 2 or more carbon atoms, with a tetracarboxylic dianhydride represented by the general formula (3):

wherein X is as defined above, and thereafter subjecting the resulting polyamic acid to thermal or chemical imidation.

11. The process according to claim 10, wherein the diamino compound represented by the general formula (2) is 1,1-bis[4-(4-aminophenoxy)-3-t-butyl-6-methylphenyl]butane, bis[4-(4-aminophenoxy)phenyl]menthane or bis[4-(4-aminophenoxy)-3,5-dimethylphenyl]tricyclo[5,2,1,0$^{2,6}$]decane.

12. The process according to claim 10, wherein the tetracarboxylic dianhydride represented by the general formula (3) is ethylene tetracarboxylic dianhydride, cyclopentane tetracarboxylic dianhydride, pyromellitic dianhydride, 3,3',4,4'-benzophenone tetracarboxylic dianhydride, 2,2',3, 3'-benzophenone tetracarboxylic dianhydride, 3,3',4,4'-biphenyl tetracarboxylic dianhydride, 2,2',3,3'-biphenyl tetracarboxylic dianhydride, 3,3',4,4'-diphenyl sulfone tetracarboxylic dianhydride, 3,3',4,4'-diphenyl hexafluoroisopropane tetracarboxylic dianhydride, 4,4'-oxydiphthalic dianhydride, 2,3,6,7-naphthalene tetracarboxylic dianhydride, 1,4,5,8-naphthalene tetracarboxylic dianhydride, 1,2, 5,6-naphthalene tetracarboxylic dianhydride, 2,2,6,7-anthracene tetracarboxylic dianhydride, 1,2,7,8-phenanthrene tetracarboxylic dianhydride, 4-(1,2-dicarboxyethyl)-4-methyl-1,2,3,4-tetrahydro- 1,2-naphthalene dicarboxylic dianhydride, 2,2-bis[4-(3,4-dicarboxyphenoxy)phenyl]propane dianhydride, 5-(1,2-dicarboxyethyl)-3-methyl-1,2,5,6-tetrahydrophthalic dianhydride or 6-methyl-tricyclo[ $6,2,2,0^{2,7}$ ]-dodeca-6,11-diene-3,4,9,10-tetracarboxylic dianhydride.

13. The process according to claim 10, wherein the molar ratio of the diamino compound to the tetracarboxylic dianhydride is 1/0.5 to 1.2.

14. The process according to claim 13, wherein the molar ratio is 1/1.

15. The process according to claim 10, wherein the diamino compound is reacted with the tetracarboxylic dianhydride at a temperature of not higher than 250° C.

16. The process according to claim 15, wherein the resulting polyamic acid is subjected to thermal imidization at a temperature of 100° to 400° C. or to chemical imidization in the presence of dehydrating agent.

* * * * *